United States Patent
Lee et al.

(10) Patent No.: US 11,626,467 B2
(45) Date of Patent: Apr. 11, 2023

(54) DISPLAY PANEL AND DISPLAY DEVICE HAVING THE SAME

(71) Applicant: Samsung Display Co., Ltd., Yongin-Si (KR)

(72) Inventors: Sunhwa Lee, Yongin-si (KR); Mukyung Jeon, Ulsan (KR); Hyeongseok Kim, Hwaseong-si (KR); Gyungsoon Park, Seoul (KR); Youngwan Seo, Suwon-si (KR); Kyunghoon Chung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 44 days.

(21) Appl. No.: 17/152,934

(22) Filed: Jan. 20, 2021

(65) Prior Publication Data

US 2021/0320164 A1    Oct. 14, 2021

(30) Foreign Application Priority Data

Apr. 10, 2020 (KR) ........................ 10-2020-0044287

(51) Int. Cl.
*H01L 27/32* (2006.01)
*G09G 3/3258* (2016.01)

(52) U.S. Cl.
CPC ....... *H01L 27/3276* (2013.01); *G09G 3/3258* (2013.01); *G09G 2300/0809* (2013.01); *G09G 2320/0233* (2013.01); *G09G 2330/021* (2013.01)

(58) Field of Classification Search
CPC .. G09G 3/3258; G09G 3/3233; G09G 3/3291; H01L 27/3276; H01L 27/3216
See application file for complete search history.

(56) References Cited

U.S. PATENT DOCUMENTS

| | | | |
|---|---|---|---|
| 10,437,377 B2 | 10/2019 | Akimoto | |
| 11,037,994 B2* | 6/2021 | Sun | ........................ H01L 27/326 |
| 2018/0145118 A1 | 5/2018 | Kim et al. | |
| 2020/0152134 A1* | 5/2020 | Lee | ........................ G09G 3/3258 |
| 2020/0381495 A1 | 12/2020 | Jeon et al. | |

FOREIGN PATENT DOCUMENTS

KR    10-2018-0056446    5/2018

* cited by examiner

*Primary Examiner* — Sardis F Azongha
(74) *Attorney, Agent, or Firm* — F. Chau & Associates, LLC

(57) ABSTRACT

A display panel includes a first display area having a first light transmittance and a second display area having a second light transmittance that is higher than the first light transmittance. The display panel further comprises a plurality of first pixels disposed in the first display area and a plurality of second pixels disposed in the second display area. A first power line is connected to the plurality of first pixels. The first power line is configured to provide a first power voltage. A second power line is connected to the plurality of second pixels. The second power line is configured to provide a second power voltage having a voltage level that is different from a voltage level of the first power voltage.

21 Claims, 21 Drawing Sheets

DISPLAY PANEL AND DISPLAY DEVICE HAVING THE SAME

CROSS-REFERENCE TO RELATED APPLICATIONS

This application claims priority under 35 U.S.C. § 119 to Korean Patent Application No. 10-2020-0044287, filed on Apr. 10, 2020 in the Korean Intellectual Property Office, the disclosure of which is incorporated by reference in its entirety herein.

TECHNICAL FIELD

The present inventive concepts relate to a display panel and a display device having the same, and more particularly, to a display panel having a display area with increased display quality.

DISCUSSION OF RELATED ART

A display device may include various electronic components such as a display panel, an input sensing unit for sensing an external input, and an electronic module. The electronic components may be electrically connected to each other by signal lines arranged in various manners. The display panel includes a light emitting element for generating light.

The input sensing unit may include sensing electrodes for sensing an external input. The electronic module may include a camera, an infrared sensing sensor, a proximity sensor, and the like. The electronic module may be disposed below the display panel.

SUMMARY

The present inventive concepts provide a display panel and a display device having the same. The display panel which may improve the display quality of a display area on which an electronic module is disposed.

An embodiment of the present inventive concepts provides a display panel including a first display area having a first light transmittance and a second display area having a second light transmittance higher than the first light transmittance.

In an embodiment of the present inventive concepts, a display panel includes a first display area having a first light transmittance and a second display area having a second light transmittance that is higher than the first light transmittance. The display panel further comprises a plurality of first pixels disposed in the first display area and a plurality of second pixels disposed in the second display area. A first power line is connected to the plurality of first pixels. The first power line is configured to provide a first power voltage. A second power line is connected to the plurality of second pixels. The second power line is configured to provide a second power voltage having a voltage level that is different from a voltage level of the first power voltage.

In an embodiment of the present inventive concepts, a display panel includes a first display area having a first resolution and a second display area having a second resolution that is lower than the first resolution. The display panel includes a first common cathode electrode disposed in the first display area and a second common cathode electrode disposed in the second display area. An electronic module is disposed below the second display area.

In an embodiment, the display panel may further include a first source power line electrically connected to the first common cathode electrode and configured to provide a first source power voltage. A second source power line is electrically connected to the second common cathode electrode and is configured to provide a second source power voltage having a voltage level that is different from a voltage level of the first source power voltage.

BRIEF DESCRIPTION OF THE DRAWINGS

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION OF EMBODIMENTS

Figure 1A:
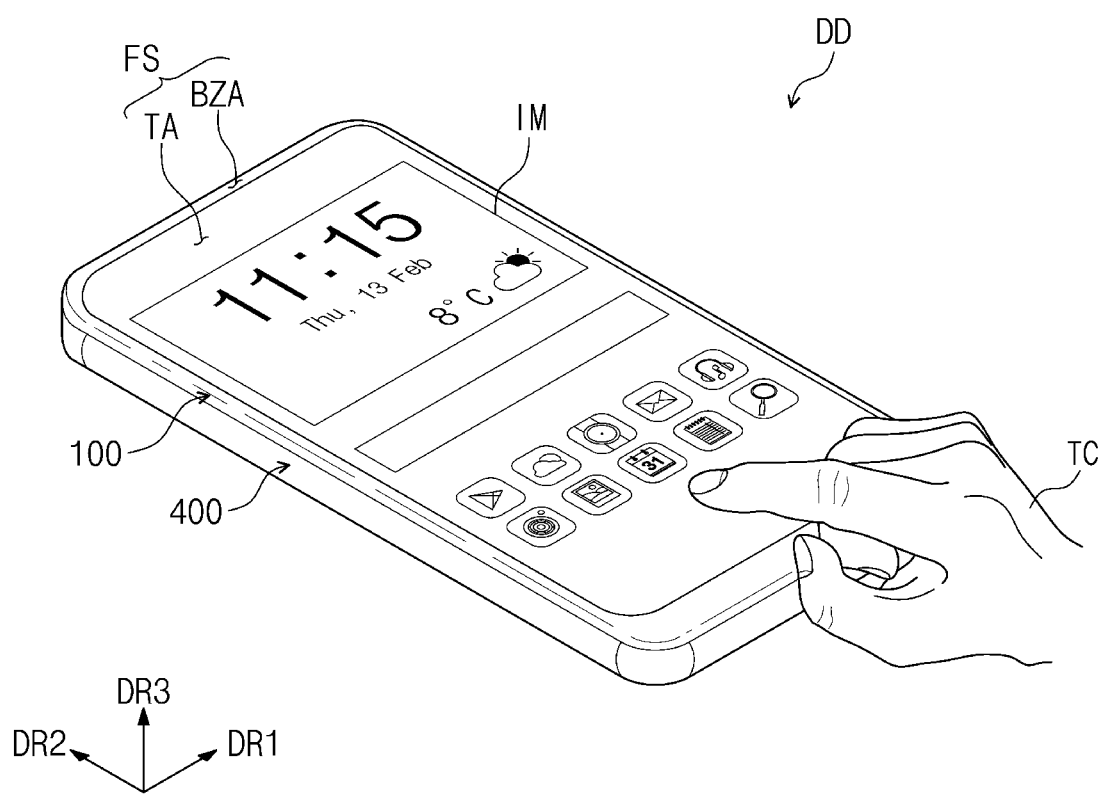
FIG. 1A is a perspective view of a display device according to an embodiment of the present inventive concepts.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween. However, when an element (or a region, a layer, a portion, etc.) is referred to as being "directly on," "directly connected to," or "directly coupled to" another element, no intervening element(s) may be disposed therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of embodiments of the present inventive concepts. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present inventive concepts pertain. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments of the present inventive concepts will be described with reference to the accompanying drawings.

Figure 1B:
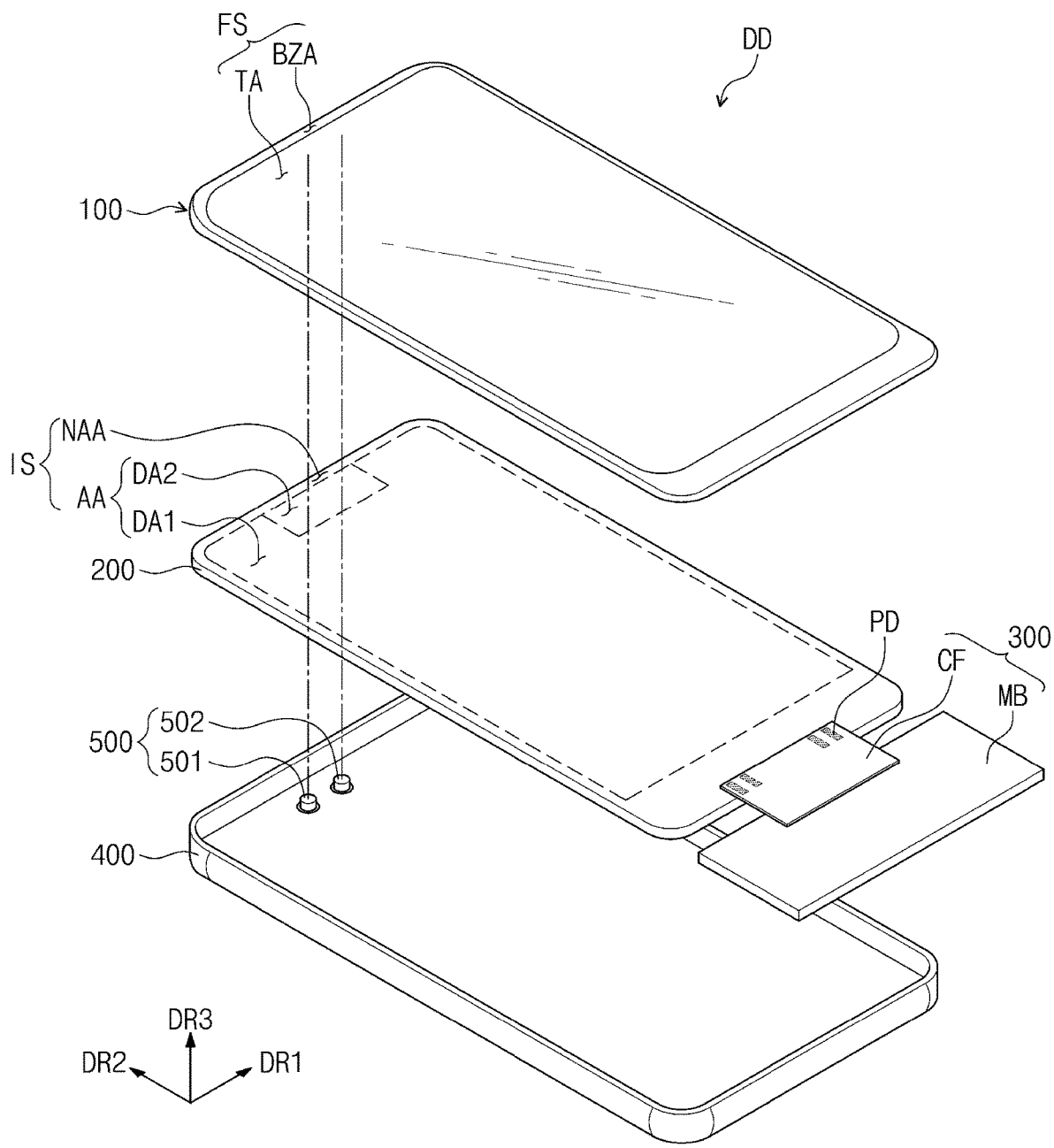
FIG. 1B is an exploded perspective view of a display device an embodiment of the present inventive concepts.
Figure 2:
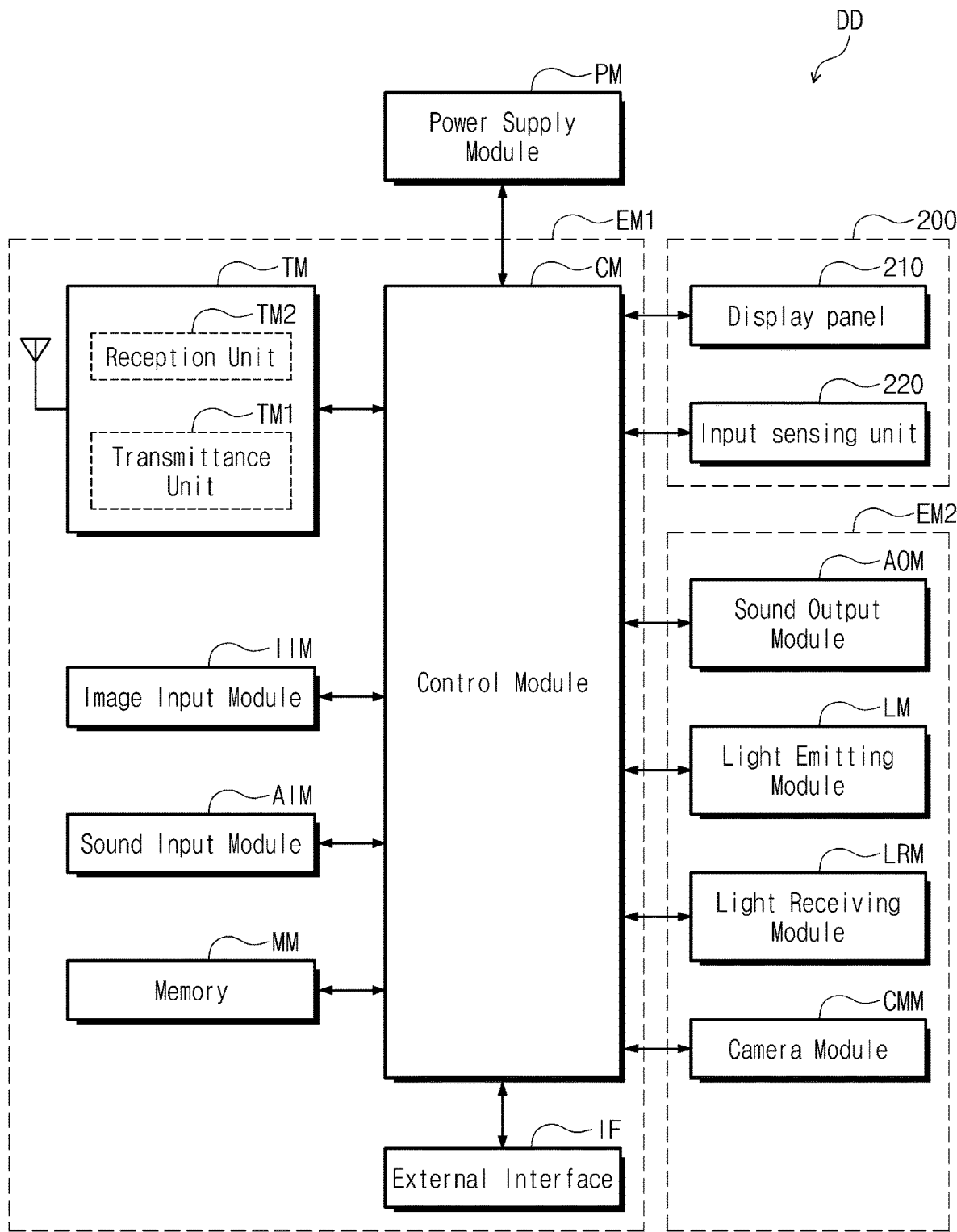
FIG. 2 is a block diagram of a display device according to an embodiment of the present inventive concepts.

FIG. 1A is a perspective view of a display device according to an embodiment of the present inventive concepts. FIG. 1B is an exploded perspective view of a display device according to an embodiment of the present inventive concepts. FIG. 2 is a block diagram of a display device according to an embodiment of the present inventive concepts.

Referring to the embodiments of FIG. 1A to FIG. 2, a display device DD may be a device activated by an electrical signal. The display device DD may include various embodiments. For example, the display device DD may include a tablet, a laptop, a computer, a television, and the like. In the present embodiment, the display device DD is exemplarily illustrated as being a smart phone. However, embodiments of the present inventive concepts are not limited thereto.

The display device DD may display an image IM toward a third direction DR3 on a display surface FS that extends in a plane defined in a first direction DR1 and a second direction DR2 that are perpendicular to the third direction DR3. The display surface FS on which the image IM is displayed may correspond to a front surface of the display device DD and may correspond to a front surface FS of a window 100. Hereinafter, the same reference numeral FS will be used for the display surface and the front surface of the display device DD, and the front surface of the window 100. In an embodiment, the image IM may include at least one moving image and/or still image. For example, in the embodiment of FIG. 1A, a watch window and application icons are illustrated as an example of the image IM.

In the present embodiment, a front surface (e.g., an upper surface) and a back surface (e.g., a lower surface) of each member are defined on the basis of a direction in which the image IM is displayed. The front surface and the rear surface are opposite to each other in the third direction DR3 and the normal direction of each of the front surface and the rear surface may be parallel to the third direction DR3. The directions indicated by the first to third directions DR1, DR2, and DR3 are a relative concept, and may be converted to different directions in other embodiments. Furthermore, while the first to third direction DR1, DR2 and DR3 are perpendicular to each other in the embodiment of FIG. 1A, in other embodiments the first to third directions DR1, DR2 and DR3 may cross each other at different angles.

As shown in the embodiment of FIG. 1B, the display device DD may include the window 100, a display module 200, a driving circuit unit 300, a housing 400, and electronic modules 500. In an embodiment, the window 100 and the housing 400 may be coupled to each other to provide the appearance of the display device DD.

The window 100 may include an optically transparent insulation material. For example, the window 100 may include glass or plastic. The window 100 may have a multi-layered structure or a single-layered structure. For example, in an embodiment, the window 100 may include a plurality of plastic films bonded with an adhesive, or a glass substrate and a plastic film bonded to each other with an adhesive.

In a plane (e.g., defined in the first direction DR1 and the second direction DR2), the window 100 may be divided into a transmissive area TA and a bezel area BZA. In the present disclosure, "on a plane" may mean when viewed from the direction DR3. Also, a "thickness direction" may mean the third direction DR3.

In an embodiment, the transmissive area TA may be an optically transparent area. The bezel area BZA may be a region having a relatively low light transmittance as compared to the transmissive area TA. The bezel area BZA may define the shape of the transmissive area TA. The bezel area BZA is adjacent to the transmissive area TA, and may surround the transmissive area TA (e.g., in the first and second directions DR1, DR2).

In an embodiment, the bezel area BZA may have a predetermined color. The bezel area BZA may cover a peripheral area NAA of the display module 200 and may block the peripheral NAA from being viewed from the outside by the user. However, embodiments of the present inventive concepts are not limited thereto. For example, in other embodiments, the bezel area BZA may be omitted and the window 100 may be variously arranged.

The display module 200 may be disposed below the window 100 (e.g., in the third direction DR3). In the present specification, the term 'below' may mean a direction opposite to a direction in which the display module 200 provides the image IM. The display module 200 may display the image IM and sense a user input TC, such as a touch of the user's finger as shown in the embodiment of FIG. 1A. The display module 200 may include a front surface IS having an active area AA and the peripheral area NAA. The active area AA may be a region activated by an electrical signal.

In an embodiment, the active area AA may be a region in which the image IM is displayed, and a region in which the user input TC is sensed. In an embodiment, the transmission area TA overlaps (e.g., in the third direction DR3) at least a partial portion of the active area AA. For example, the transmissive area TA may overlap the front surface or at least a partial portion of the active area AA. Accordingly, a user may view the image IM through the transmissive area TA, or provide the user input TC through the transmissive area TA.

The peripheral area NAA may be a region covered by the bezel area BZA. The peripheral area NAA is adjacent to the active area AA. For example, as shown in the embodiment of FIG. 1B, the peripheral area NAA may surround the active area AA. For example, the peripheral area NAA may completely surround the active area AA in the first and second directions DR1 and DR2. However, embodiments of the present inventive concepts are not limited thereto. A driving circuit or a driving wiring may be disposed on the peripheral area NAA for driving the active area AA.

In an embodiment, the display module 200 is assembled in a flat state in which the active area AA and the peripheral area NAA face toward the window 100. However, embodiments of the present inventive concepts are not limited thereto and a portion of the peripheral area NAA may be bent in other embodiments. The portion of the peripheral area NAA may face toward the back surface of the display device DD (e.g., in the third direction DR3) so that the area of the bezel area BZA on the front surface of the display device DD may be reduced. Alternately, the display module 200 may be assembled in a state in which a portion of the active area AA is also bent. Alternately, in the display module 200 according to an embodiment of the present inventive concepts, the peripheral area NAA may be omitted.

The active area AA of the display module 200 may include a plurality of display areas. The plurality of display areas may have different light transmittances. In an embodiment of the present inventive concepts, the active area AA of the display module 200 includes a first display area DA1 and a second display area DA2. The second display area DA2 may have a relatively higher light transmittance than the light transmittance of the first display area DA1.

The driving circuit unit 300 may be electrically connected to the display module 200. The driving circuit unit 300 may include a main circuit board MB and a flexible film CF.

The flexible film CF is electrically connected to the display module 200. The flexible film CF may be connected to pads PD of the display module 200 disposed in the peripheral area NAA. The flexible film CF may provide an electrical signal to the display module 200 for driving the display module 200. The electrical signal may be generated from the flexible film CF or from the main circuit board MB. The main circuit board MB may include various driving circuits for driving the display module 200 or connectors for supplying power.

The electronic modules 500 may include a first electronic module 501 and a second electronic module 502. On a plane (e.g., defined in the first and second directions DR1 and DR2), the first and second electronic modules 501 and 502 may overlap the second display area DA2 (e.g., in the third direction DR3). The first and second electronic modules 501 and 502 may be disposed below the display module 200. The first and second electronic modules 501 and 502 may receive an external input transmitted through the second display area DA2 or may output a signal through the second display area DA2. For example, since the second display area DA2 has a higher light transmittance than the first display area DA1, the electronic modules 500 may easily transmit and/or receive a signal through the second display area DA2.

The housing 400 is coupled to the window 100. The housing 400 is coupled to the window 100 to provide an internal space. The display module 200 and the electronic modules 500 may be housed in the internal space.

The housing 400 may include a material having a relatively high rigidity. For example, in an embodiment, the housing 400 may include glass, plastic, or a metal, or a plurality of frames and/or a plate composed of a combination thereof. However, embodiments of the present inventive concepts are not limited thereto. The housing 400 may stably protect the components of the display device DD housed in the internal space from an external impact.

Referring to the embodiment of FIG. 2, the display device DD may include the display module 200, a power supply module PM, a third electronic module EM1, and a fourth electronic module EM2. The display module 200, the power supply module PM, the third electronic module EM1, and the fourth electronic module EM2 may be electrically connected to each other.

The display module 200 may include a display panel 210 and an input sensing unit 220.

The display panel 210 may be a component which substantially generates the image IM. The image IM generated by the display panel 210 is displayed on the front surface IS for viewing by a user from the outside through the transmission area TA.

The input sensing unit 220 senses the user input TC (refer to FIG. 1A) applied from the outside. For example, the input sensing unit 220 may sense the user input TC which is provided to the window 100. The user input includes various forms of inputs such as a part of a user's body, light, heat, a pen, or pressure. In the embodiment shown in FIG. 1A, the user input TC is illustrated as a user's hand applied to the front surface FS. However, embodiments of the present inventive concepts are not limited thereto. As described above, the user input TC may be provided in various forms, and may also sense the user input TC applied to a side surface or a rear surface of the display device DD according to the structure of the display device DD, and is not limited to any one embodiment.

The power supply module PM supplies power required for the overall operation of the display device DD. In an embodiment, the power supply module PM may include a typical battery module.

The third electronic module EM1 and the fourth electronic module EM2 may include various functional modules for operating the display device DD.

The third electronic module EM1 may be directly mounted on a mother board electrically connected to the display module 200, or may be mounted on a separate substrate and electrically connected to the mother board through a connector and the like.

As shown in the embodiment of FIG. 2, the third electronic module EM1 may include a control module CM, a wireless communication module TM, an image input module IIM, a sound input module AIM, a memory MM, and an external interface IF. Some of the modules may not be mounted on the mother board, but instead, may be electrically connected to the mother board through a flexible printed circuit board.

The control module CM controls the overall operation of the display device DD. In an embodiment, the control module CM may be a microprocessor. For example, the control module CM either activates or deactivates the display module 200. The control module CM may control other modules, such as the image input module IIM or the sound input module AIM on the basis of a touch signal received from the display module 200.

The wireless communication module TM may transmit/receive wireless signals with other terminals using Bluetooth or a Wi-Fi line. The wireless communication module TM may transmit/receive voice signals using a general communication line. The wireless communication module TM may include a transmittance unit TM1 for modulating and then transmitting a signal to be transmitted and a reception unit TM2 for demodulating the received signal.

The image input module IIM processes an image signal and converts the processed image signal into image data displayable on the display module 200. The sound input module AIM receives an external sound signal through a microphone in a recording mode, a voice recognition mode, and the like, and converts the received external sound signal into electrical voice data.

The external interface IF may serve as an interface to be connected to an external charger, a wired/wireless data port, a card (e.g., a memory card or a SIM/UIM card) socket, and the like.

The fourth electronic module EM2 may include a sound output module AOM, a light emitting module LM, a light receiving module LRM, a camera module CMM, and the like. The above components may be directly mounted on a mother board or on a separate substrate and electrically connected to the display module 200 or electrically connected to the third electronic module EM1 through a connector and the like.

The sound output module AOM converts sound data received from the wireless communication module TM or sound data stored in the memory MM and outputs the converted sound data to the outside.

The light emitting module LM generates and outputs light. For example, in an embodiment, the light emitting module LM may output an infrared ray. The light emitting module LM may include an LED element. The light emitting module LM may sense an infrared ray. The light receiving module LRM may be activated when an infrared ray of a predetermined level or higher is sensed. In an embodiment, the light receiving module LRM may include a CMOS sensor. After generated infrared light is output from the light emitting module LM, the infrared light is reflected by an external object (e.g., a user's finger or face) and the reflected infrared light may be incident on the light receiving module LRM. The camera module CMM may capture an external image.

Each of the first and second electronic modules 501 and 502 according to an embodiment of the present inventive concepts may include at least one of the components of the third electronic module EM1 and the fourth electronic module EM2. For example, in an embodiment, each of the first and second electronic modules 501 and 502 may include at least one of among the output module AOM, the light emitting module LM, the light receiving module LRM, and the camera module CMM. The first and second electronic modules 501 and 502 may sense an external object received through the second display area DA2 (shown in FIG. 1B), or provide a sound signal (e.g., a voice) or a light signal (e.g., an infrared light) to the second display area DA2.

Figure 3A:
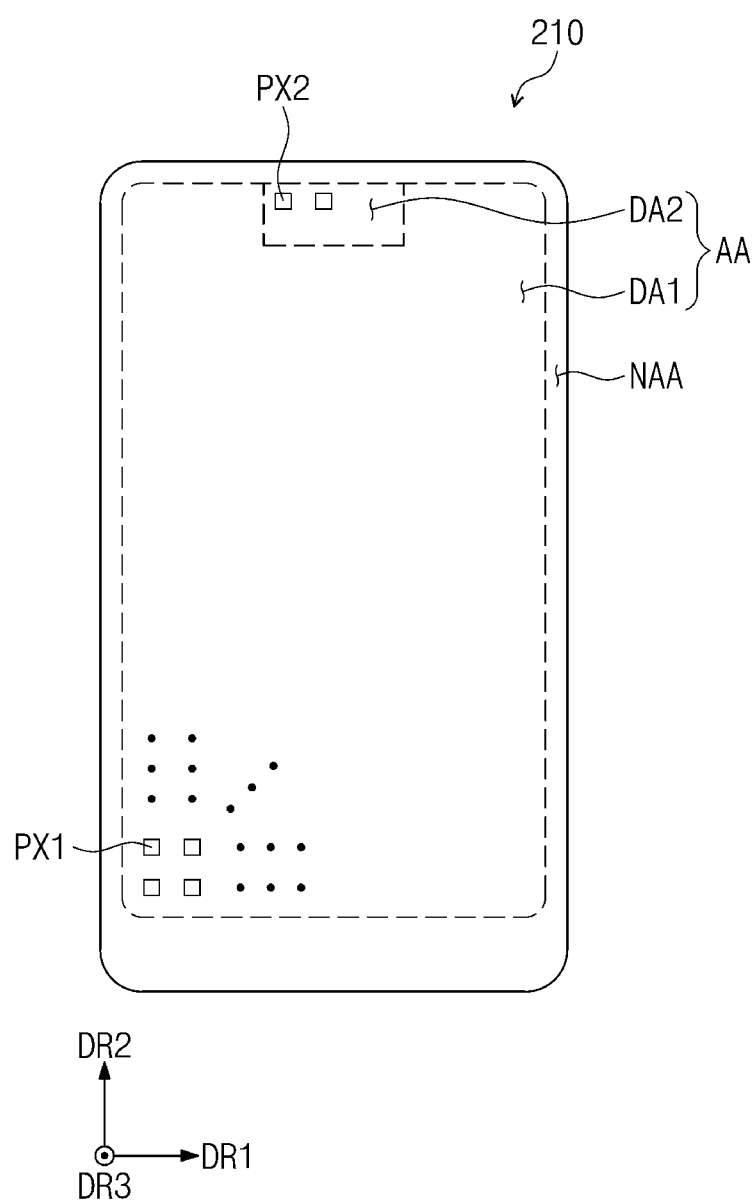
FIG. 3A is a plan view of a display panel according to an embodiment of the present inventive concepts.

FIG. 3A is a plan view of a display panel according to an embodiment of the present inventive concepts.

Referring to the embodiments of FIG. 1B and FIG. 3A, the first display area DA1 and the second display area DA2 may be defined in the display panel 210. The first display area DA1 and the second display area DA2 may correspond to the active area AA of the display module 200.

The electronic modules 500 may be disposed below the second display area DA2 (e.g., in the third direction DR3). The light transmittance of the second display area DA2 may be higher than the light transmittance of the first display area DA1. Therefore, a signal may be easily transmitted to and/or received by the electronic modules 500 through the second display area DA2. In an embodiment, some components of the second display area DA2 may be omitted to increase the light transmittance of the second display area DA2. For example, some of the pixels disposed in the second display area DA2 may be removed.

The first display area DA1 and the second display area DA2 may be adjacent to each other. As shown in the embodiment of FIG. 3A, the second display area DA2 may have a quadrangular shape, and at least one side defining the second display area DA2 may be immediately adjacent to the first display area DA1. For example, as shown in the embodiment of FIG. 3A, the second display area DA2 may have a rectangular shape and three sides of the second display area DA2 are immediately adjacent to the first display area DA1. The one side of the second display area DA2 that is not immediately adjacent to the first display area DA1 is immediately adjacent to the peripheral area NAA. However, embodiments of the present inventive concepts are not limited thereto and the second display area DA2 may have various shapes in which one or more sides of the second display area DA2 are immediately adjacent to the first display area DA1. Also, in an embodiment of the present inventive concepts, when viewed in a plane, the second display area DA2 may be defined above the display panel 210.

First pixels PX1 are disposed in the first display area DA1, and second pixels PX2 may be disposed in the second display area DA2. The first pixels PX1 and the second pixels PX2 may be pixels for generating light. The number of the first pixels PX1 and the number of the second pixels PX2 in the same area (e.g., an identical area defined in the first and second directions DR1, DR2) may be different from each other. For example, the number of the second pixels PX2 in an area in the second display area DA2 may be less than the number of the first pixels PX1 in an identically-sized area in the first display area DA1. Therefore, the light transmittance of the second display area DA2 may be relatively higher than the light transmittance of the first display area DA1. Also, the resolution of the second display area DA2 may be lower than the resolution of the first display area DA1.

In an embodiment, each of the first and second pixels PX1 and PX2 may have substantially the same configuration. The configuration of the first and second pixels PX1 and PX2 will be described with reference to the drawings.

Figure 3B:
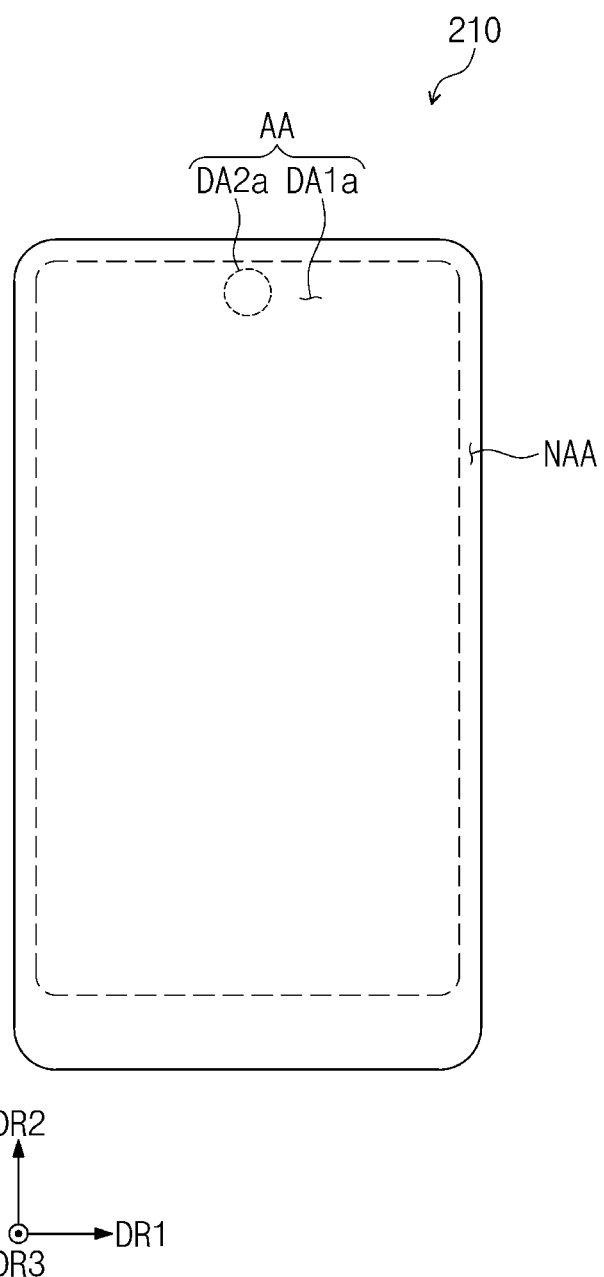
FIG. 3B is a plan view of a display panel according to an embodiment of the present inventive concepts.

FIG. 3B is a plan view of a display panel according to an embodiment of the present inventive concepts. Hereinafter, in the description of FIG. 3B, the same reference numerals are given to the components described with reference to FIG. 3A, and the descriptions of substantially identical elements are omitted for convenience of explanation.

Referring to the embodiments of FIG. 1B to FIG. 3B, a first display area DA1a and a second display area DA2a may be defined on the display panel 210. The second display area DA2a may have a circular shape and the entire perimeter of the second display area DA2a may be directly adjacent to the first display area DA1a. The electronic modules 500 may be disposed below the second display area DA2a. The second display area DA2a may be surrounded by the first display area DA1a (e.g., in the first and second directions DR1, DR2).

In the embodiments of FIG. 3A and FIG. 3B, the display panel 210 includes one second display area DA2 and DA2a. However, embodiments of the present inventive concepts are not limited thereto. For example, in another embodiment, two or more second display areas DA2 and DA2a may be included in the display panel 210. In an embodiment, the two or more second display areas DA2 and DA2a may have the same light transmittance. However, embodiments of the present inventive concepts are not limited thereto and in another embodiment, the plurality of the second display areas DA2 and DA2a may have different light transmittances from each other.

Figure 4A:
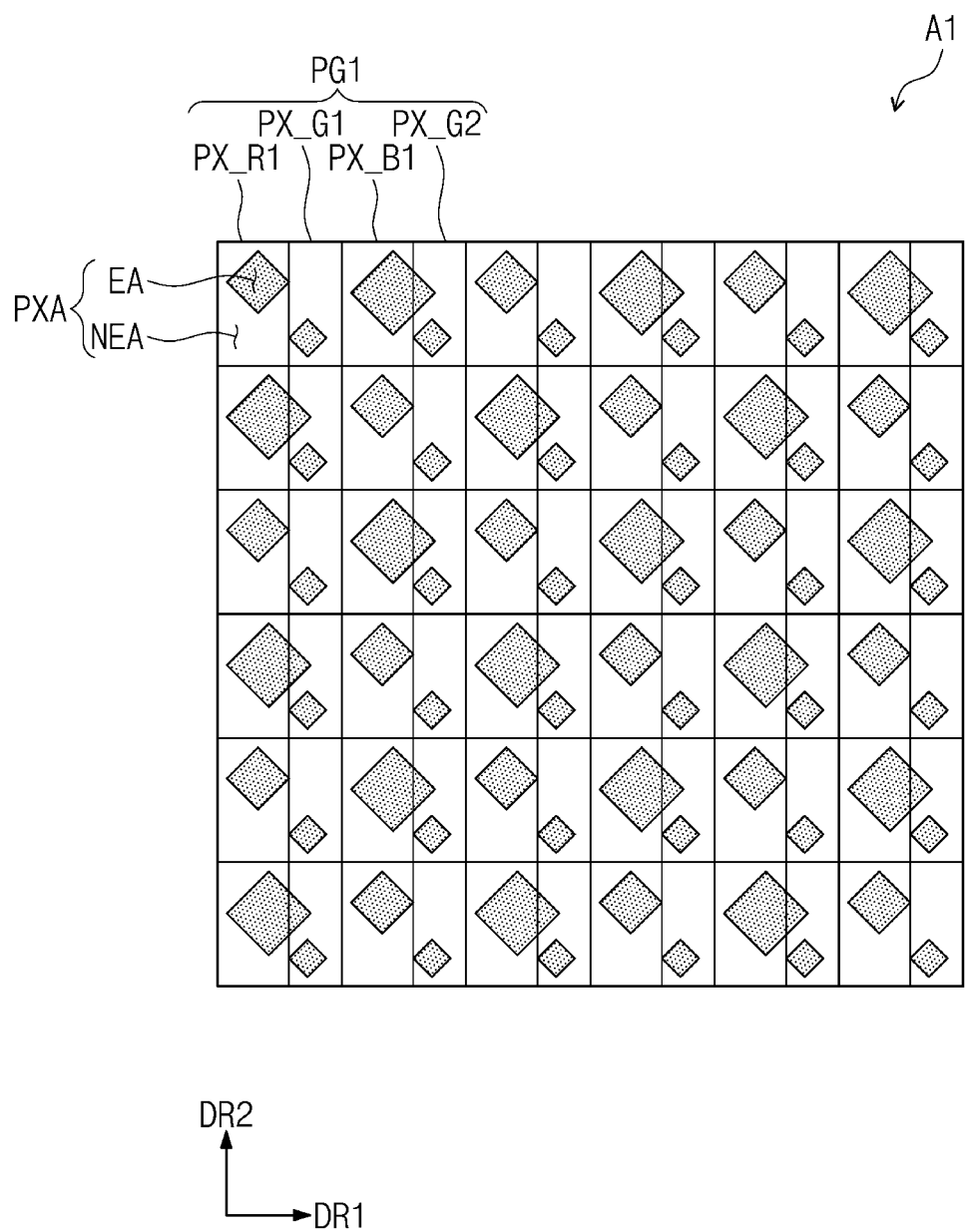
FIG. 4A is a plan view illustrating an enlarged portion of a first display area according to an embodiment of the present inventive concepts.
Figure 4B:
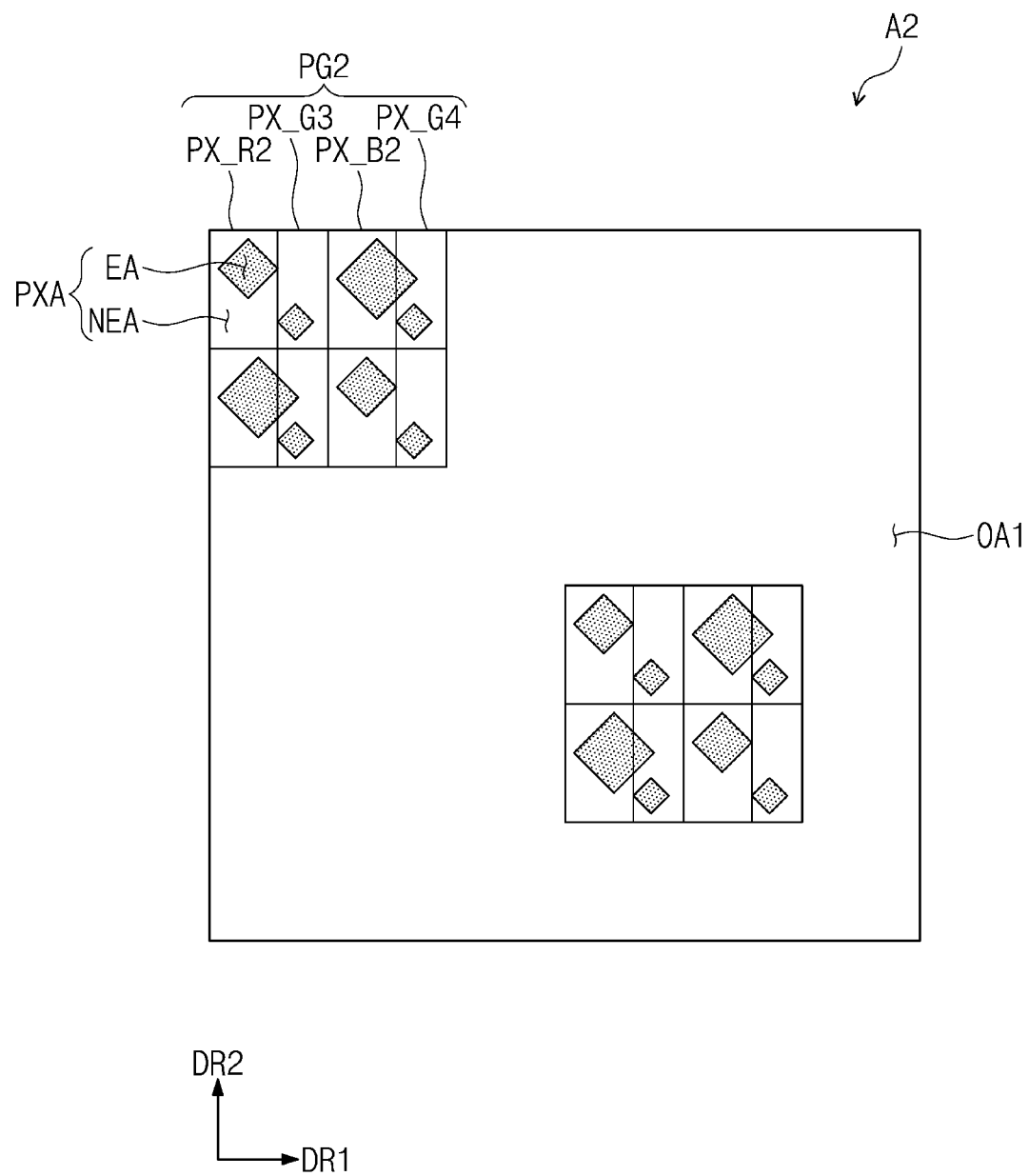
FIG. 4B is a plan view illustrating an enlarged portion of a second display area according to an embodiment of the present inventive concepts.

FIG. 4A is a plan view illustrating an enlarged portion of a first display area according to an embodiment of the present inventive concepts, and FIG. 4B is a plan view illustrating an enlarged portion of a second display area according to an embodiment of the present inventive concepts.

Referring to the embodiment of FIG. 3A and FIG. 4A, a plurality of first pixels PX1 may be disposed in the first display area DA1. The first pixels PX1 may be disposed spaced apart from each other in the first direction DR1 and/or the second direction DR2.

As shown in the embodiment of FIG. 4A, the first pixels PX1 may include a plurality of red pixels PX_R1, a plurality of green pixels PX_G1 and PX_G2, and a plurality of blue pixels PX_B1. The first pixels PX1 may be grouped into a plurality of first pixel groups PG1. For example, the first pixel group PG1 may include one first red pixel PX_R1, two first green pixels PX_G1 and PX_G2, and one first blue pixel PX_B1. Each of the first pixels PX1 of the first pixel group PG1 may include a light emitting area EA and a non-light emitting area NEA. In an embodiment of the present inventive concepts, the light emitting area EA may have a quadrangular shape, such as a rhombus shape. However, embodiments of the present inventive concepts are not limited thereto. A first light emitting element LD1 (shown in FIG. 5A) is disposed in the light emitting area EA and first to seventh transistors T1 to T7 (shown in FIG. 5A) for driving the first light emitting element LD1 may be disposed in the non-light emitting area NEA.

As shown in the embodiment of FIG. 4A, a plurality of the first pixel groups PG1 may be disposed in a first area A1 of the first display area DA1. The first area A1 may mean a unit area. For example, in an embodiment, a size of the first area A1 may be 1 inch in the first direction DR1×1 inch in the second direction DR2 and equal to 1 inch².

In the first area A1, the first pixel groups PG1 may be disposed in a matrix shape. For example, the plurality of the first pixel groups PG1 may be disposed spaced apart from each other in the first direction DR1 and/or the second direction DR2.

In the embodiment of FIG. 4A, 18 first pixel groups PG1 are illustrated as being disposed in the first area A1. However, embodiments of the present inventive concepts are not limited thereto and the number of the first pixel groups PG1 may vary in other embodiments. For example, in another embodiment, the number of the first pixel groups PG1 disposed in the first area A1 may be greater than 18 first pixel groups PG1.

Referring to the embodiments of FIG. 3A and FIG. 4B, a plurality of the second pixels PX2 may be disposed in a second area A2 of the second display area DA2. The second area A2 may include pixel areas PXA in which each of the plurality of the second pixels PX2 is respectively disposed and an opening area OA1 is disposed between the plurality of the second pixels PX2. In the opening area OA1, substantially no pixels may be disposed. For example, the opening area OA1 may be areas in which some components of the second pixels PX2 (e.g., a second light emitting element LD2) are removed. Therefore, the resolution of the first display area DA1 in the unit area may be higher than the resolution of the second display area DA2 in a unit area of the same size.

The second pixels PX2 may have the same structure as the first pixels PX1. The second pixels PX2 may be grouped into a plurality of second pixel groups PG2. For example, the second pixel group PG2 may include one second red pixel PX_R2, two second green pixels PX_G3 and PX_G4, and one second blue pixel PX_B2. Each pixel area PXA may include the light emitting area EA and the non-light emitting area NEA. In an embodiment of the present inventive concepts, the light emitting area EA may have a quadrangular shape. However, embodiments of the present inventive concepts are not limited thereto. The second light emitting element LD2 (shown in FIG. 5B) is disposed in the light emitting area EA and the first to seventh transistors T1 to T7 (shown in FIG. 5B) for driving the second light emitting element LD2 may be disposed in the non-light emitting area NEA.

The second area A2 may also be defined as a unit area like the first area A1. For example, the second area A2 and the first area A1 may have the same area (e.g., in a plane defined in the first and second directions DR1, DR2).

In an embodiment, the second area A2 may include two second pixel groups PG2. Portions other than the pixel areas PXA in which the second pixel groups PG2 are disposed in the second area A2 may be defined as the opening area OA1. The opening area OA1 may transmit light provided from the outside. Accordingly, sensors disposed in the second display area DA2 may recognize light transmitted through the opening area OA1 and sense the input information of a user.

As shown in the embodiment of FIG. 4B, the total area of the pixel areas PXA in the second area A2 may be smaller than the total area of the opening area OA1.

Figure 4C:
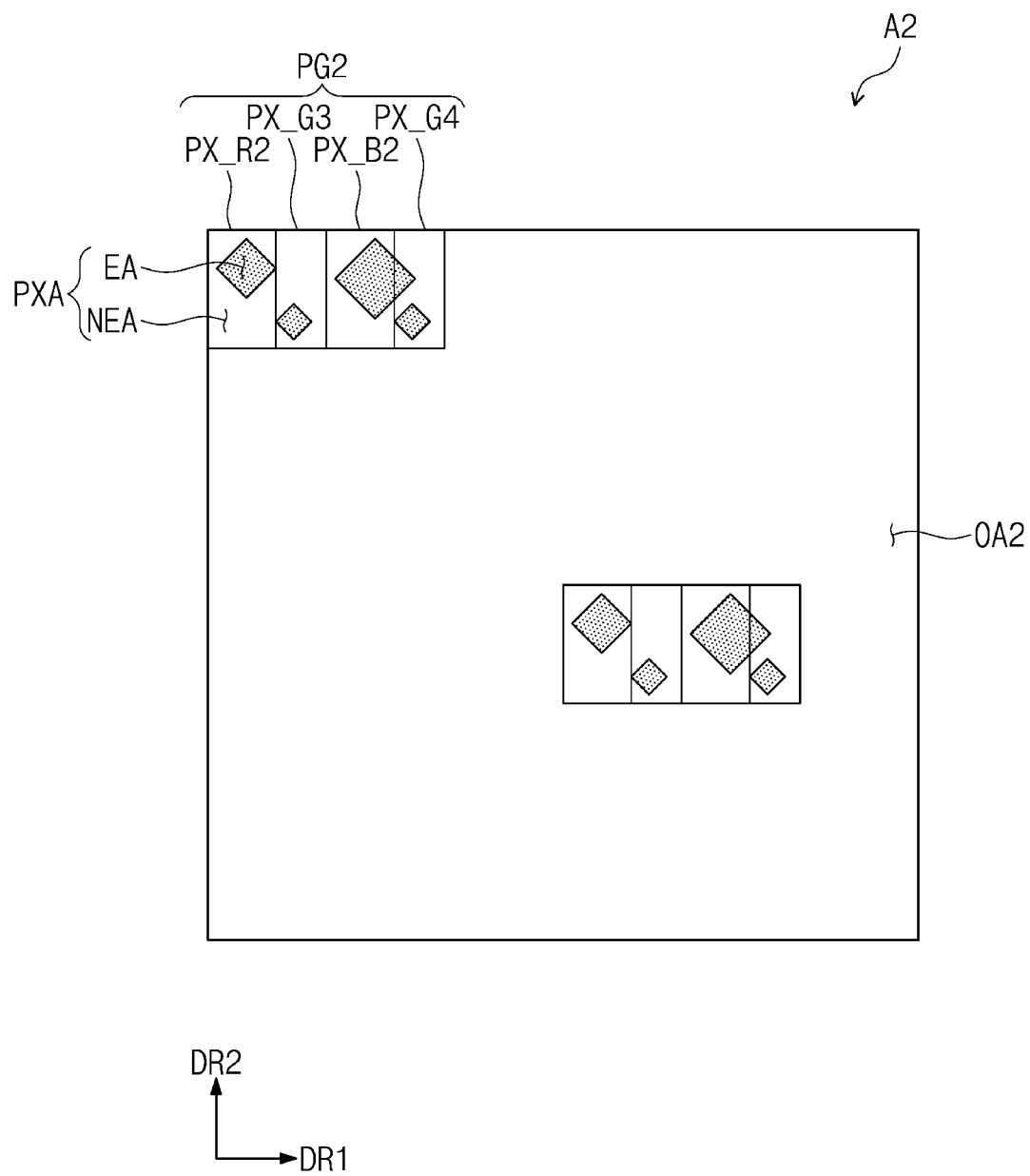
FIG. 4C is a plan view illustrating an enlarged portion of a second display area according to an embodiment of the present inventive concepts.

Referring to the embodiment of FIG. 4C, two second pixel groups PG2 may be disposed in the second area A2. Portions other than the pixel areas PXA in which the second pixel groups PG2 are disposed in the second area A2 may be defined as an opening area OP2. The opening area OA2 of the second area A2 illustrated in the embodiment of FIG. 4C may have a larger area than the opening area OA1 of the second area A2 illustrated in the embodiment of FIG. 4B. Accordingly, the recognition rate and sensing sensitivity of light of the sensors disposed in the second display area DA2 may be improved.

Figure 5A:
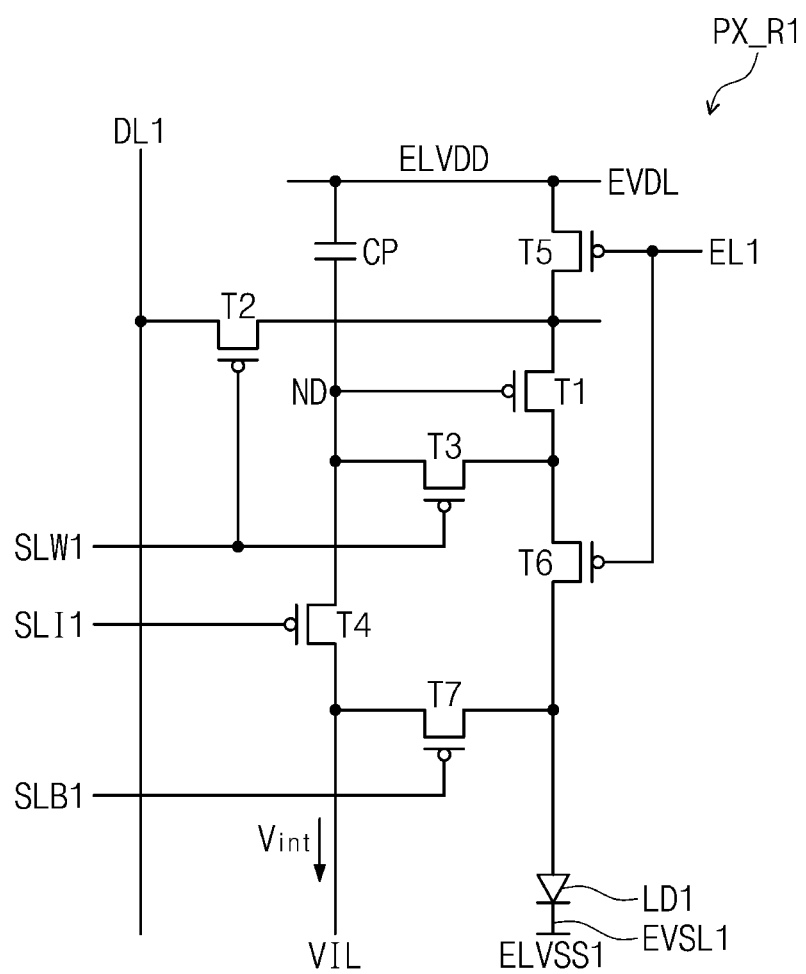
FIG. 5A is an equivalent circuit diagram of a first red pixel according to an embodiment of the present inventive concepts.

FIG. 5A is an equivalent circuit diagram of a first red pixel according to an embodiment of the present inventive concepts.

Referring to the embodiment of FIG. 5A, the first red pixel PX_R1 may include a plurality of transistors, such as first to seventh transistors T1 to T7, a capacitor CP, and the first light emitting element LD1. The first to seventh transistors T1 to T7 and the capacitor CP may control the amount of current flowing in the first light emitting element LD1 in response to a data signal and a scan signal.

Each of the first to seventh transistors T1 to T7 may include an input electrode (or a source electrode), an output electrode (or a drain electrode), and a control electrode (or a gate electrode). In the present specification, one of the input electrode and the output electrode may be referred to as a first electrode, and the other one thereof may be referred to as a second electrode for convenience.

The first electrode of a first transistor T1 may be connected to a driving power line EVDL via a fifth transistor T5. The first electrode may be a source electrode or a drain electrode. The driving power line EVDL may be a wiring provided with a driving power voltage ELVDD. The second electrode of the first transistor T1 is connected to a first anode electrode of the first light emitting element LD1 via a sixth transistor T6. The second electrode may be a source electrode or a drain electrode.

The first transistor T1 may control the amount of current flowing in the first light emitting element LD1 in correspondence to a voltage applied to the control electrode of the first transistor T1.

A second transistor T2 is connected between a data line DL1 and the first electrode of the first transistor T1. In addition, the control electrode of the second transistor T2 is connected to a second scan line SLW1. When a second scan signal is provided to the second scan line SLW1, the second transistor T2 is turned on to electrically connect the data line DL1 and the first electrode of the first transistor T1.

A third transistor T3 is connected between the second electrode of the first transistor T1 and the control electrode of the first transistor T1. The control electrode of the third transistor T3 is connected to the second scan line SLW1. When the second scan signal is provided to the second scan line SLW1, the third transistor T3 is turned on to electrically connect the second electrode of the first transistor T1 and the control electrode of the first transistor T1. Accordingly, when the third transistor T3 is turned on, the first transistor T1 is connected in a diode form.

A fourth transistor T4 is connected between a node ND and an initialization voltage line VIL. In addition, the control electrode of the fourth transistor T4 is connected to a first scan line SLI1. The node ND may be a node to which the fourth transistor T4 and the control electrode of the first transistor T1 are connected. When a first scan signal is provided to the first scan line SLI1, the fourth transistor T4 is turned on to provide an initialization voltage Vint to the node ND. In an embodiment, the first scan signal may be a signal generated prior to the second scan signal. For example, the first scan signal may be the same signal as a signal applied to the second scan line SLW1 of a pixel in the previous row.

The fifth transistor T5 is connected between the driving power line EVDL and the first electrode of the first transistor T1. The sixth transistor T6 is connected between the second electrode of the first transistor T1 and an anode electrode of the first light emitting element LD1. The control electrode of the fifth transistor T5 and the control electrode of the sixth transistor T6 are connected to a first light emitting control wiring EL1.

A seventh transistor T7 is connected between the initialization voltage line VIL and the first anode electrode of the first light emitting element LD1. The control electrode of the seventh transistor T7 is connected to a third scan line SLB1. When a third scan signal is provided to the third scan line SLB1, the seventh transistor T7 is turned on to provide the initialization voltage Vint to the first anode electrode of the first light emitting element LD1. For example, the third scan signal may be the same signal as a signal applied to the first scan line SLI1 of a pixel in the next row.

Additionally, FIG. 5A illustrates the control electrode of the seventh transistor T7 being connected to the third scan line SLB1. However, embodiments of the present inventive concepts are not limited thereto. For example, in another embodiment of the present inventive concepts, the control electrode of the seventh transistor T7 may be connected to the second scan line SLW1.

In the embodiment of FIG. 5A, the first to seventh transistors T1 to T7 are illustrated as being a PMOS transistor. However, embodiments of the present inventive concepts are not limited thereto. In another embodiment of the present inventive concepts, one or more of the first to seventh transistors T1 to T7 may be composed of an NMOS transistor.

The capacitor CP is disposed between the driving power line EVDL and the node ND. The capacitor CP stores a voltage corresponding to a data signal. When the fifth transistor T5 and the sixth transistor T6 are turned on, the amount of current flowing in the first transistor T1 may be determined in accordance to the voltage stored in the capacitor CP.

The first light emitting element LD1 may be electrically connected to the sixth transistor T6 and a first source power line EVSL1. A first anode electrode of the first light emitting element LD1 is connected to the sixth transistor T6, and a first cathode electrode of the first light emitting element LD1 is connected to the first source power line EVSL1. A first source power voltage ELVSS1 may be applied to the first source power line EVSL1. The first source power voltage ELVSS1 has a lower level than the driving power voltage ELVDD. Therefore, the first light emitting element LD1 may emit light according to a voltage in correspondence to the difference between a signal transmitted through the sixth transistor T6 and the first source power voltage ELVSS1.

In embodiments of the present inventive concepts, the structure of the first red pixel PX_R1 is not limited to the structure shown in the embodiment of FIG. 5A. For example, in another embodiment of the present inventive concepts, the first red pixel PX_R1 may be implemented in various forms for emitting the light emitting element LD1. Additionally, while the control electrodes for the first to seventh transistors T1 to T7 are shown as single gate electrodes in the embodiment of FIG. 5A, in other embodiments, one or more of the control electrodes may be dual gate electrodes, etc.

Figure 5B:
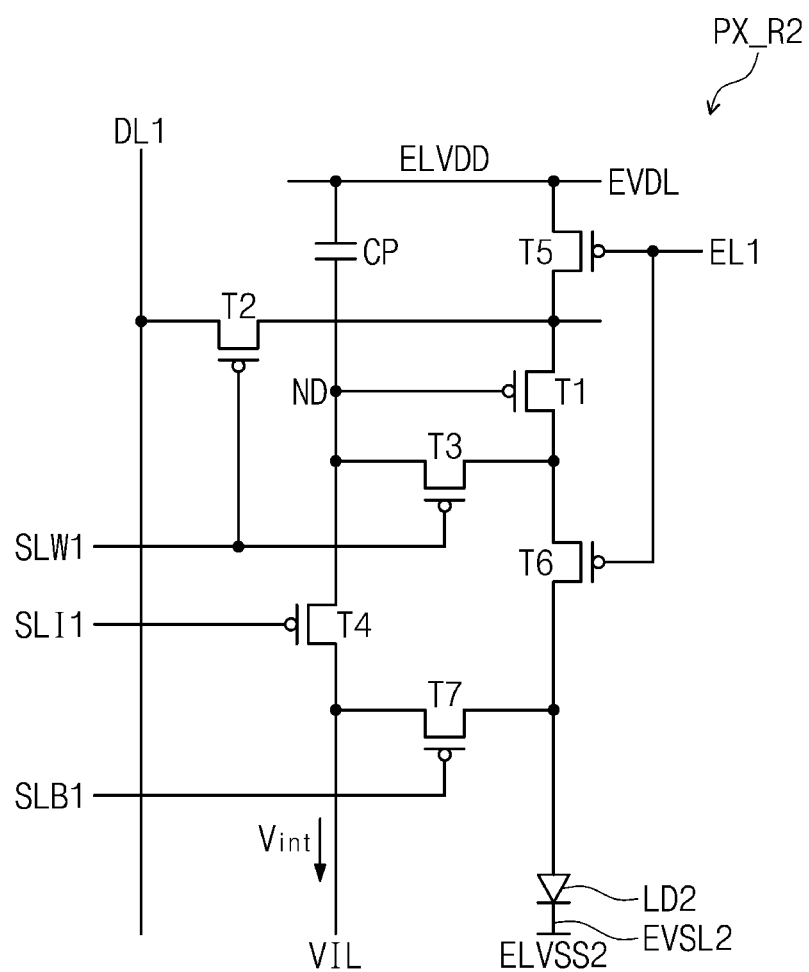
FIG. 5B is an equivalent circuit diagram of a second red pixel according to an embodiment of the present inventive concepts.

FIG. 5B is an equivalent circuit diagram of a second red pixel according to an embodiment of the present inventive concepts. Hereinafter, in the description of FIG. 5B, the same reference numerals are given to the components described with reference to FIG. 5A, and the descriptions of substantially identical elements are omitted for convenience of explanation.

Referring to the embodiment of FIG. 5B, the second red pixel PX_R2 may include a plurality of transistors, such as first to seventh transistors T1 to T7, a capacitor CP, and the second light emitting element LD2. The first to seventh transistors T1 to T7 and the capacitor CP may control the amount of current flowing in the first light emitting element LD1 in response to a data signal and a scan signal.

For example, a second cathode electrode of the second light emitting element LD2 is connected to a second source power line EVSL2 to receive a second source power voltage ELVSS2 in contrast to the first cathode electrode of the first light emitting element LD1. In an embodiment of the present inventive concepts, the second source power voltage ELVSS2 may have a voltage level that is lower than the voltage level of the first source power voltage ELVSS1. For example, in an embodiment, when the first source power voltage ELVSS1 is about −3.3 V, the second source power voltage ELVSS2 may be a voltage in a range of about −5 V to about −6 V.

Therefore, the second light emitting element LD2 may emit light according to a voltage in correspondence to the difference between a signal transmitted through the sixth transistor T6 and the second source power voltage ELVSS2. For example, even when a signal of the same magnitude as the signal input to the first anode electrode of the first light emitting element LD1 is transferred to a second anode electrode of the second light emitting element LD2, a driving current of the second light emitting element LD2 is increased by the difference between the second source power voltage ELVSS2 and the first source power voltage ELVSS1. Therefore, under the same input signal, the second light emitting element LD2 may output light having a higher luminance compared to the first light emitting element LD1, and as a result, the sharpness of the second display area DA2 may be improved.

Figure 6:
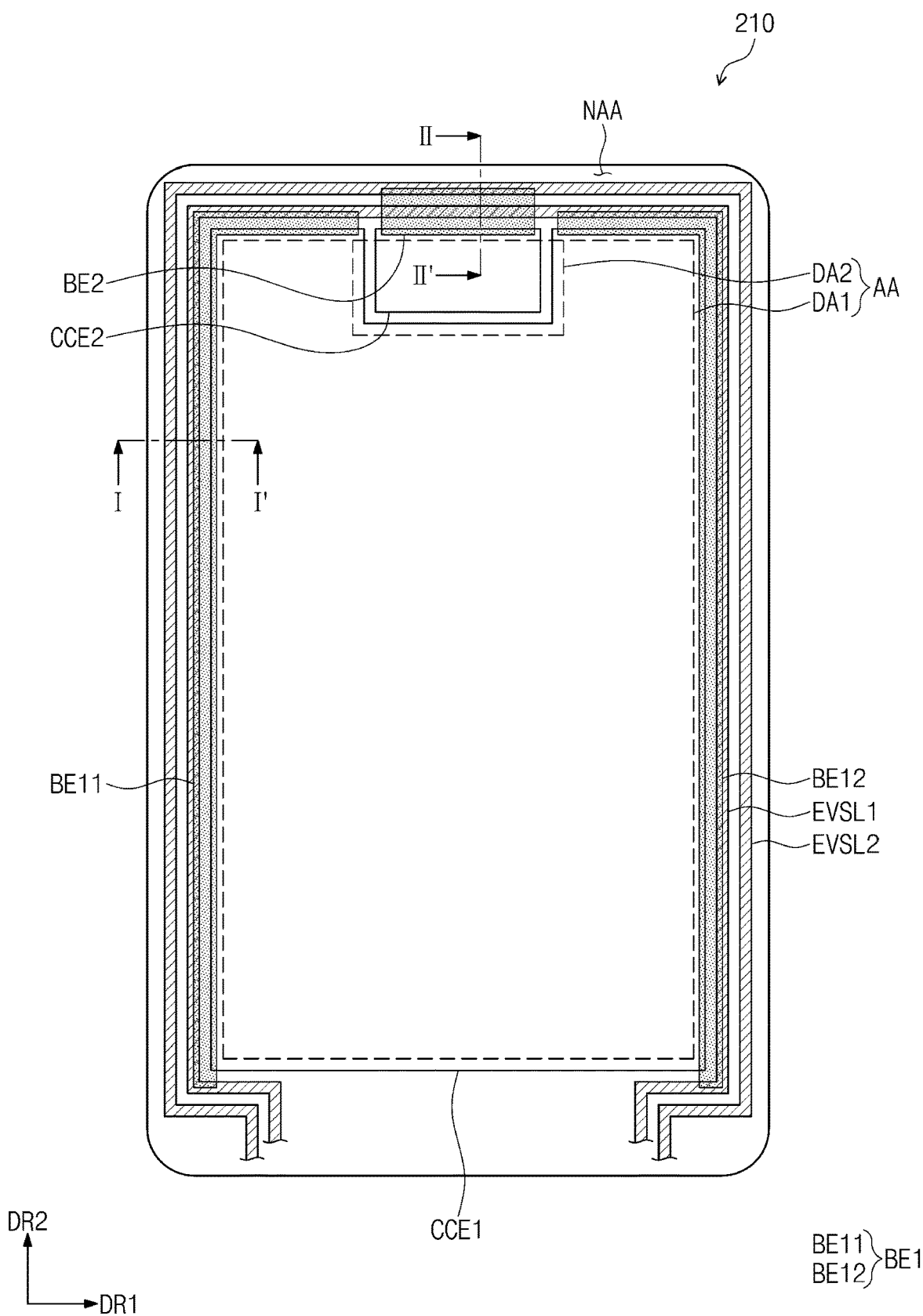
FIG. 6 is a plan view showing a wiring layout of a display panel according to an embodiment of the present inventive concepts.
Figure 7A:
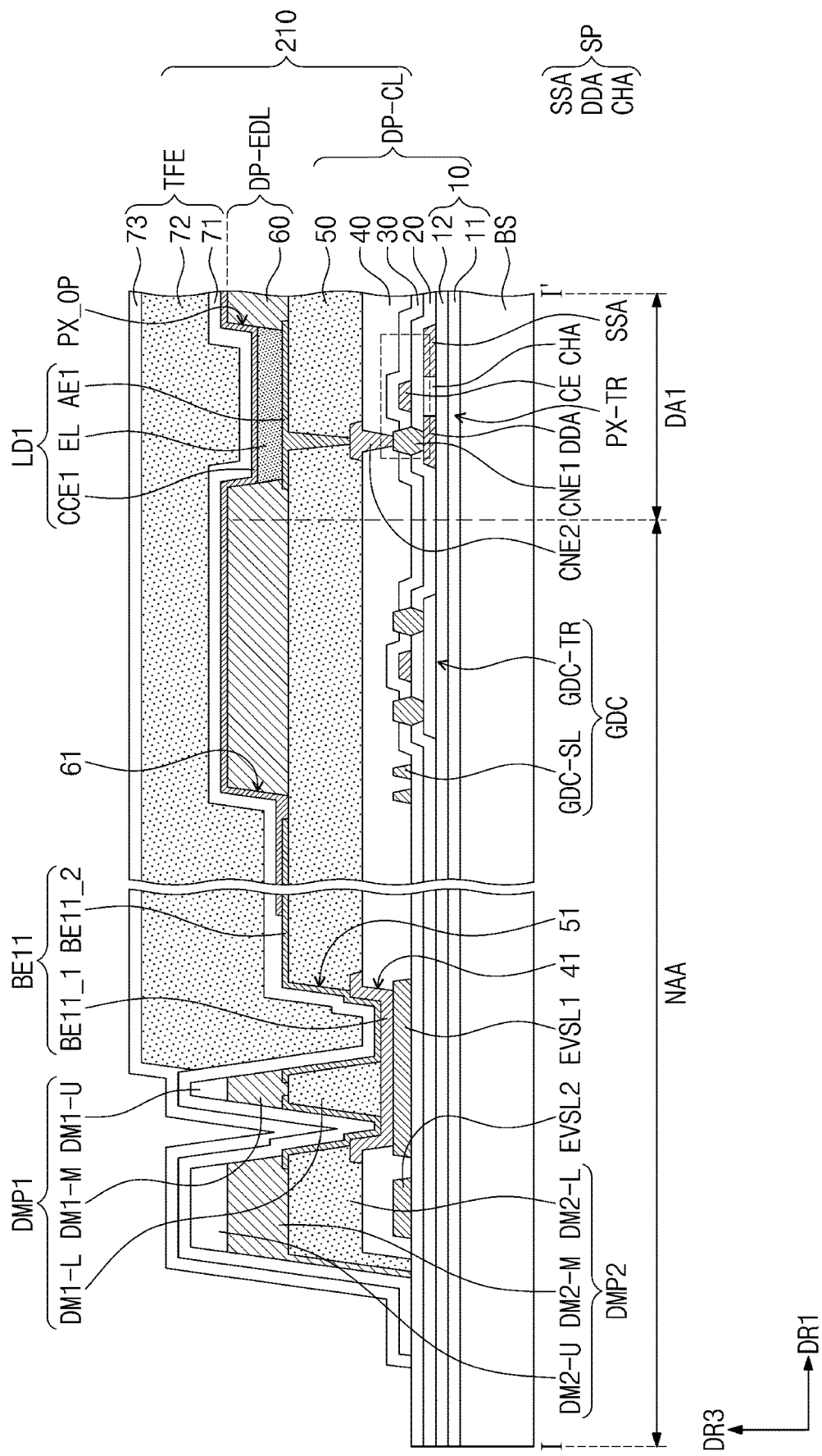
FIG. 7A is a cross-sectional view taken along line I-I' illustrated in FIG. 6 according to an embodiment of the present inventive concepts.
Figure 7B:
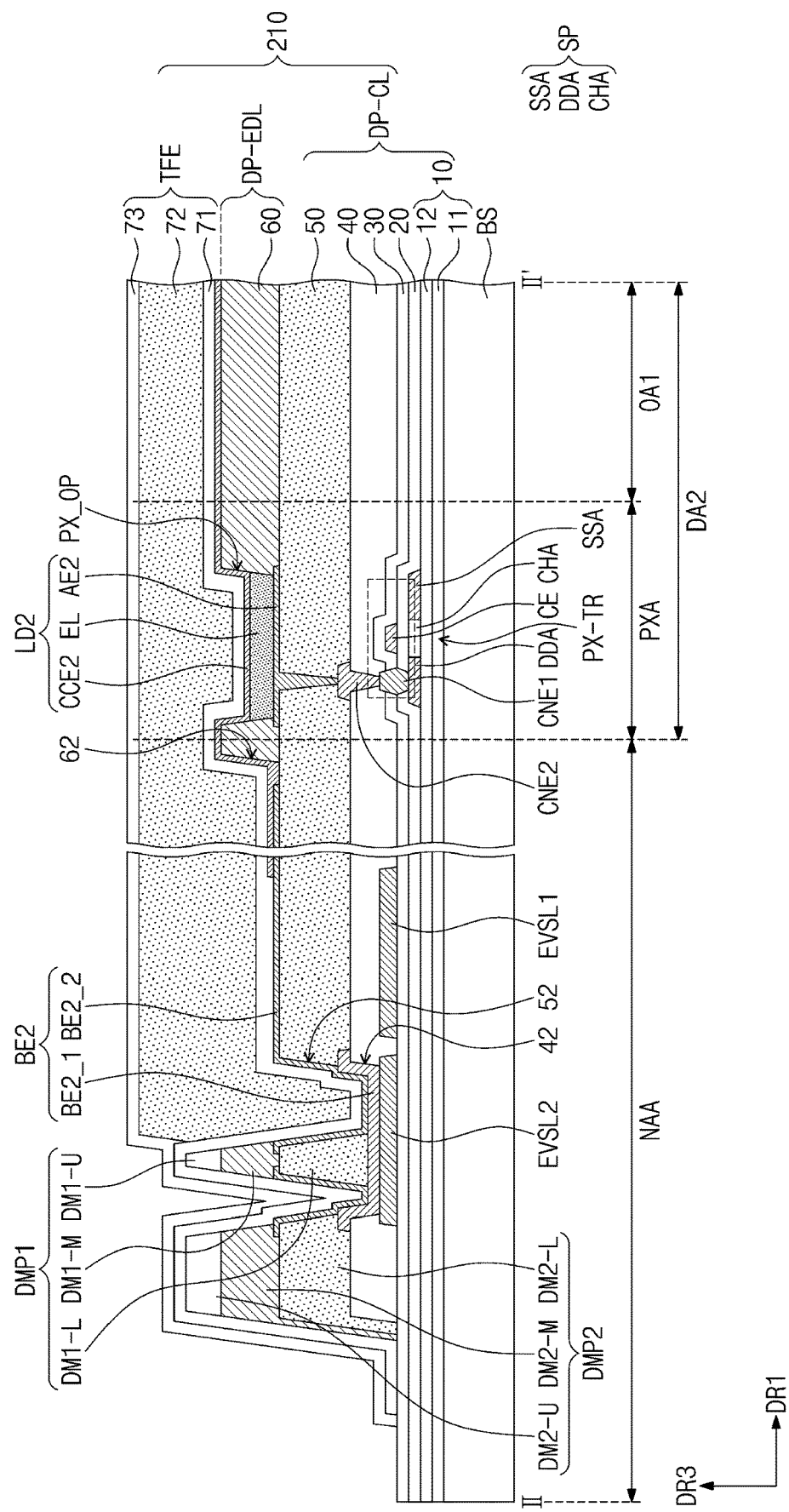
FIG. 7B is a cross-sectional view taken along line II-II' illustrated in FIG. 6 according to an embodiment of the present inventive concepts.

FIG. 6 is a plan view showing a wiring layout of a display panel according to an embodiment of the present inventive concepts. FIG. 7A is a cross-sectional view taken along line I-I' illustrated in FIG. 6, and FIG. 7B is a cross-sectional view taken along line II-II' illustrated in FIG. 6.

Referring to the embodiment of FIG. 6, the active area AA of the display panel 210 may be a region on which an image is displayed, and the peripheral area NAA may be a region on which a driving circuit, a driving wiring, and the like may be disposed. In the embodiment of FIG. 6, the active area AA of the display panel 210 includes the first and second display areas DA1 and DA2. A first common cathode electrode CCE1 is disposed in the first display area DA1 and a second common cathode electrode CCE2 is disposed in the second display area DA2. The first and second common cathode electrodes CCE1 and CCE2 may be spaced apart from each other (e.g., in the first direction DR1 and/or second direction DR2) and electrically insulated from each other.

The first common cathode electrode CCE1 may be defined as an electrode formed by commonly connecting first cathode electrodes of first light emitting elements LD1 provided in the first pixels PX1 illustrated in the embodiments of FIG. 3A and FIG. 5A. For example, the first cathode electrodes of the first light emitting elements LD1 may be integrally formed and provided in the form of a single electrode, such as the first common cathode electrode CCE1.

The second common cathode electrode CCE2 may be defined as an electrode formed by commonly connecting second cathode electrodes of second light emitting elements LD2 provided in the second pixels PX2 illustrated in the embodiments of FIG. 3A and FIG. 5B. For example, the second cathode electrodes of the second light emitting elements LD2 may be integrally formed and provided in the form of a single electrode, such as the second common cathode electrode CCE2.

The first source power line EVSL1 electrically connected to the first common cathode electrode CCE1 and the second source power line EVSL2 electrically connected to the second common cathode electrode CCE2 are disposed in the peripheral area NAA. As shown in the embodiment of FIG. 6, the first and second source power lines EVSL1 and EVSL2 may be disposed to surround three sides of the active area AA. However, embodiments of the present inventive concepts are not limited thereto. Pads extended from both ends of the first and second source power lines EVSL1 and EVSL2 may be disposed in the peripheral area NAA in which the pads PD (shown in FIG. 1B) of the display panel 210 are also disposed.

As illustrated in the embodiment of FIG. 6, the first source power line EVSL1 may be disposed further inside than the second source power line EVSL2. For example, the first source power line EVSL1 is disposed closer to the active area AA than the second source power line EVSL2.

The first source power line EVSL1 is electrically connected to the first common cathode electrode CCE1 through a first bridge electrode BE1, and the second source power line EVSL2 is electrically connected to the second common cathode electrode CCE2 through a second bridge electrode BE2. The first bridge electrode BE1 may be formed along the first source power line EVSL1. The first bridge electrode BE1 may include a left bridge electrode BE11 and a right bridge electrode BE12 separated based on the second display area DA2.

When viewed in a plane, the first source power line EVSL1 partially overlaps the first bridge electrode BE1, and the first common cathode electrode CCE1 partially overlaps the first bridge electrode BE1. As illustrated in the embodiment of FIG. 6, the first common cathode electrode CCE1 may be extended to the peripheral area NAA. Therefore, the first common cathode electrode CCE1 may overlap the first bridge electrode BE1 in the peripheral area NAA.

The second bridge electrode BE2 is disposed between an end of the left bridge electrode BE11 adjacent to the second display area DA2 and an end of the right bridge electrode BE12 (e.g., in the first direction DR1) and the second bridge electrode BE2 separates the left bridge electrode BE11 and the right bridge electrode BE12. The second bridge electrode BE2 is spaced apart from the left and right bridge electrodes BE11 and BE12, and is electrically insulated from the left and right bridge electrodes BE11 and BE12.

When viewed in a plane, the second source power line EVSL2 partially overlaps the second bridge electrode BE2, and the second common cathode electrode CCE2 partially overlaps the second bridge electrode BE2. The second bridge electrode BE2 may also partially overlap the first source power line EVSL1 in a region adjacent to the second display area DA2.

As illustrated in the embodiment of FIG. 6, the second common cathode electrode CCE2 may be extended to the peripheral area NAA. Therefore, the second common cathode electrode CCE2 may overlap the second bridge electrode BE2 in the peripheral area NAA.

Referring to the embodiments of FIG. 7A and FIG. 7B, the display panel 210 includes a base layer BS, a circuit element layer DP-CL, a light emitting element layer DP-EDL, and a thin film encapsulation layer TFE. In an embodiment, the base layer BS, the circuit element layer DP-CL, the light emitting element layer DP-EDL, and the thin film encapsulation layer TFE may be sequentially stacked in the third direction DR3.

The base layer BS may be a member which provides a base surface on which the circuit element layer DP-CL is disposed. In an embodiment, the base layer BS may be a glass substrate, a metal substrate, a plastic substrate, and the like. However, embodiments of the present inventive concepts are not limited thereto. The base layer BS may be an inorganic layer, an organic layer, or a composite material layer.

The circuit element layer DP-CL is disposed on the base layer BS. The circuit element layer DP-CL may include the first to seventh transistors T1 to T7 (see FIG. 5A and FIG. 5B), the capacitor CP (see FIG. 5A and FIG. 5B), and the like. In FIG. 7A and FIG. 7B, for convenience of explanation, only one transistor PX-TR (hereinafter, referred to as a pixel transistor) is illustrated. For example, the pixel transistor PX-TR may be the sixth transistor T6 described with reference to the embodiments of FIG. 5A and FIG. 5B.

The circuit element layer DP-CL further includes first to sixth insulation layers 10, 20, 30, 40, 50 and 60 stacked in the third direction DR3. A first insulation layer 10 is disposed on the base layer BS. The first insulation layer 10 may include a barrier layer 11 and a buffer layer 12.

The barrier layer 11 may include an inorganic matter. The barrier layer 11 may prevent oxygen or moisture introduced through the base layer BS from penetrating into the first and second pixels PX1 and PX2 (see FIG. 3A). The buffer layer 12 may include an inorganic matter. The buffer layer 12 may provide the first and second pixels PX1 and PX2 with surface energy that is lower than the surface energy of the base layer BS such that the first and second pixels PX1 and PX2 are stably formed on the base layer BS. In the embodiments of FIG. 7A and FIG. 7B, each of the barrier layer 11 and the buffer layer 12 is illustrated as being a single layer. However, embodiments of the present inventive concepts are not limited thereto. For example, in an embodiment, both the barrier layer 11 and the buffer layer 12 may be provided in a plurality and alternately stacked. Alternately, at least one of the barrier layer 11 and the buffer layer 12 may be provided in a plurality or omitted.

The pixel transistor PX-TR may be disposed on the first insulation layer 10. The pixel transistor PX-TR includes a semiconductor pattern SP and a control electrode CE. The semiconductor pattern SP is disposed on the first insulation layer 10. The semiconductor pattern SP may include a semiconductor material. In an embodiment, the semiconductor pattern SP may include a channel portion CHA, a source portion SSA, and a drain portion DDA. The semiconductor pattern SP is covered by a second insulation layer 20 and the control electrode CE may be disposed on the second insulation layer 20. The control electrode CE is disposed on the second insulation layer 20 in correspondence to the channel portion CHA of the semiconductor pattern SP. For example, the control electrode CE and the channel portion CHA of the semiconductor pattern SP are spaced apart by the second insulation layer 20 and the control electrode CE overlaps the channel portion CHA in the third direction DR3. The control electrode CE may be connected to one electrode of the capacitor CP.

The source portion SSA and the drain portion DDA of the semiconductor pattern SP may be spaced apart from each other (e.g., in the first direction DR1). The channel portion CHA is disposed between the source portion SSA and the drain portion DDA of the semiconductor pattern SP (e.g., in the first direction DR1). The source portion SSA of the semiconductor pattern SP may be used as an input electrode of the pixel transistor PX-TR, and the drain portion DDA of the semiconductor pattern SP may be used as an output electrode of the pixel transistor PX-TR.

A third insulation layer 30 is disposed on the control electrode CE and the second insulation layer 20. A contact hole for exposing the drain portion DDA of the semiconductor pattern SP may be provided in the second and third insulation layers 20 and 30. A first connection electrode CNE1 is disposed on the third insulation layer 30 and extends through the contact hole for electrical connection to the drain portion DDA. However, embodiments of the present inventive concepts are not limited thereto. For example, in another embodiment, the pixel transistor PX-TR may further include an input electrode and an output electrode respectively connected to the source portion SSA and the drain portion DDA of the semiconductor pattern SP.

A fourth insulation layer 40 is disposed on the third insulation layer 30. The fourth insulation layer 40 may be an inorganic layer and/or an organic layer, and may have a single-layered structure or a multi-layered structure.

A second connection electrode CNE2 may be disposed on the fourth insulation layer 40. The fourth insulation layer 40 may include a contact hole. The second connection electrode CNE2 may be electrically connected to the first connection electrode CNE1 through the contact hole in the fourth insulation layer 40. A fifth insulation layer 50 may be disposed on the second connection electrode CNE2. The fifth insulation layer 50 may include a contact hole.

The pixel transistor PX-TR according to an embodiment of the present inventive concepts may be formed in various configurations, and is not limited to the embodiments illustrated in FIG. 7A and FIG. 7B.

The light emitting element layer DP-EDL is disposed on the circuit element layer DP-CL. The light emitting element layer DP-EDL may include a plurality of light emitting elements.

The first light emitting element LD1 is disposed on the fifth insulation layer 50. The first light emitting element LD1 may include a first anode electrode AE1, a light emitting layer EL, and the first common cathode electrode CCE1. The first anode electrode AE1 may pass through a contact hole in the fifth insulation layer 50 to be electrically connected to the pixel transistor PX-TR through the first and second connection electrodes CNE1 and CNE2.

A sixth insulation layer 60 may be disposed on the fifth insulation layer 50. A pixel opening PX_OP is defined in the sixth insulation layer 60. The pixel opening PX_OP may expose at least a portion of the first anode electrode AE1. The sixth insulation layer 60 may be a pixel definition film.

The light emitting layer EL may be disposed on the first anode electrode AE1 exposed by the pixel opening PX_OP defined on the sixth insulation layer 60. The light emitting layer EL may include a light emitting material. For example, in an embodiment, the light emitting layer EL may be composed of at least one material among materials emitting red, green, and blue colors. The light emitting layer EL may include a fluorescent light emitting material or a phosphorescent light emitting material. The light emitting layer EL may include an organic light emitting material or an inorganic light emitting material. The light emitting layer EL may emit light in response to a potential difference between the first anode electrode AE1 and the first common cathode electrode CCE1.

The first common cathode electrode CCE1 may be disposed on the light emitting layer EL. The first common cathode electrode CCE1 may extend (e.g., in the first direction DR1) to be commonly provided to a plurality of first pixels PX1. The first common cathode electrode CCE1 may have a shape that corresponds to the first display area DA1. The first common cathode electrode CCE1 may be electrically connected to the first source power line EVSL1 disposed in the peripheral area NAA.

As shown in the embodiment of FIG. 7A, the first source power line EVSL1 and the first connection electrode CNE1 are disposed on the same layer. In an embodiment in which the pixel transistor PX-TR includes the input electrode and the output electrode, the first source power line EVSL1 is disposed on the same layer as the input and output electrodes of the pixel transistor PX-TR. The fourth and fifth insulation layers 40 and 50 are respectively provided with first and second contact portions 41 and 51 for exposing the first source power line EVSL1. The first and second contact portions 41 and 51 may be defined as regions in which the fourth and fifth insulation layers 40 and 50 are open in correspondence to the first source power line EVSL1.

The first bridge electrode BE1 is disposed on the first source power line EVSL1 exposed through the first and second contact portions 41 and 51. FIG. 7A illustrated the left bridge electrode BE11. However, the right bridge electrode BE12 has a similar structure as the left bridge electrode BE11. The left bridge electrode BE11 includes a first sub-bridge electrode BE11_1 and a second sub-bridge electrode BE11_2.

The first sub-bridge electrode BE11_1 is disposed on the first source power line EVSL1 and the fourth insulation layer 40. The first sub-bridge electrode BE11_1 and the second connection electrode CNE2 may be formed from the same layer. The first sub-bridge electrode BE11_1 directly contacts the first source power line EVSL1 exposed through the first contact portion 41.

The second sub-bridge electrode BE11_2 is disposed on the first sub-bridge electrode BE11_1 and the fifth insulation layer 50. For example, as shown in the embodiment of FIG. 7A, a lower surface of the second sub-bridge electrode BE11_2 may directly contact an upper surface of the first sub-bridge electrode BE11_1 and an upper surface and lateral side surface of the fifth insulation layer 50. In an embodiment, the second sub-bridge electrode BE11_2 and the first anode electrode AE1 may be formed from the same layer. The second sub-bridge electrode BE11_2 may directly contact the first source power line BE11_1 exposed through the second contact portion 51.

However, embodiments of the present inventive concepts are not limited thereto. For example, in another embodiment, the fifth insulation layer 50 may be omitted. In a structure in which the fifth insulation layer 50 is omitted, the left bridge electrode BE11 may include only the second sub-bridge electrode BE11_2. In this embodiment the second sub-bridge electrode BE11_2 may directly contact the first source power line EVSL1.

A third contact portion 61 is provided in the sixth insulation layer 60 to expose the second sub-bridge electrode BE11_2. The first common cathode electrode CCE1 disposed on the sixth insulation layer 60 may directly contact the second sub-bridge electrode BE11_2 in the third contact portion 61.

The second light emitting element LD2 is disposed on the fifth insulation layer 50. The second light emitting element LD2 may include a second anode electrode AE2, the light emitting layer EL, and the second common cathode electrode CCE2. The second anode electrode AE2 may be electrically connected to the pixel transistor PX-TR through the first and second connection electrodes CNE1 and CNE2. The light emitting layer EL may emit light in response to a potential difference between the second anode electrode AE2 and the second common cathode electrode CCE2.

As shown in the embodiment of FIG. 7B, the second common cathode electrode CCE2 may be disposed on the light emitting layer EL. The second common cathode electrode CCE2 may extend (e.g., in the first direction DR1) to be commonly provided to a plurality of second pixels PX2. The second common cathode electrode CCE2 may have a shape in correspondence to the second display area DA2. The second common cathode electrode CCE2 may be electrically connected to the second source power line EVSL2 disposed in the peripheral area NAA.

In an embodiment of the present inventive concepts, the second source power line EVSL2 and the first connection electrode CNE1 are disposed on the same layer. The fourth and fifth insulation layers 40 and 50 are respectively provided with fourth and fifth contact portions 42 and 52 for exposing the second source power line EVSL2. The fourth and fifth contact portions 42 and 52 described above may be defined as regions in which the fourth and fifth insulation layers 40 and 50 are open in correspondence to the second source power line EVSL2.

The second bridge electrode BE2 is disposed on the second source power line EVSL2 exposed through the fourth and fifth contact portions 42 and 52. The second bridge electrode BE2 includes a third sub-bridge electrode BE2_1 and a fourth sub-bridge electrode BE2_2.

The third sub-bridge electrode BE2_1 is disposed on the second source power line EVSL2 and the fourth insulation layer 40. For example, as shown in the embodiment of FIG. 7B, a lower surface of the third sub-bridge electrode BE2_1 may directly contact an upper surface of the second source power line EVSL2 and an upper surface and lateral side surface of the fourth insulation layer 40. In an embodiment, the third sub-bridge electrode BE2_1 and the second connection electrode CNE2 may be formed from the same layer. The third sub-bridge electrode BE2_1 directly contacts the second source power line EVSL2 exposed through the fourth contact portion 42.

The fourth sub-bridge electrode BE2_2 is disposed on the third sub-bridge electrode BE2_1 and the fifth insulation layer 50. For example, as shown in the embodiment of FIG. 7B, a lower surface of the fourth sub-bridge electrode BE2_2 may directly contact an upper surface of the third sub-bridge electrode BE2_1 and an upper surface and a lateral side surface of the fifth insulation layer 50. In an embodiment, the fourth sub-bridge electrode BE2_2 and the second anode electrode AE2 may be formed from the same layer. The fourth sub-bridge electrode BE2_2 may directly contact the third source power line BE2_1 exposed through the fifth contact portion 52.

However, embodiments of the present inventive concepts are not limited thereto. For example, in another embodiment, the fifth insulation layer 50 may be omitted. In an embodiment in which the fifth insulation layer 50 is omitted, the second bridge electrode BE2 may include only the fourth sub-bridge electrode BE2_2. In this embodiment, the fourth sub-bridge electrode BE2_2 may directly contact the second source power line EVSL2. In an embodiment, the first bridge electrode BE1 and the second bridge electrode BE2 may be disposed on the same layer and do not overlap each other (e.g., in the third direction DR3).

A sixth contact portion 62 is provided in the sixth insulation layer 60 to expose the fourth sub-bridge electrode BE2_2. The second common cathode electrode CCE2 disposed on the sixth insulation layer 60 may directly contact the fourth sub-bridge electrode BE2_2 through the sixth contact portion 62.

As illustrated in the embodiment of FIG. 7A, a scan driver GDC connected to the first to third scan lines SLI1, SLW1, and SLB1 (see FIG. 5A and FIG. 5B) of the first and second pixels PX1 and PX2 may be disposed between the first source power line EVSL1 and the first display area DA1 (e.g., in the first direction DR1). For example, the first and second source power lines EVSL1 and EVSL2 may be disposed further outside than the scan driver GDC is. For example, the first and second source power lines EVSL1 and EVSL2 are disposed farther from the active area AA than the scan driver GDC. The scan driver GDC may include signal wirings GDC-SL and driving transistors GDC-TR.

As illustrated in the embodiment of FIG. 7B, the scan driver GDC may not be disposed between the first source power line EVSL1 and the second display area DA2.

In addition, as illustrated in the embodiments of FIG. 4B and FIG. 7B, the transistor PX-TR and the second light emitting element LD2 may not be disposed in the opening area OA1 of the second display area DA2. As shown in the embodiment of FIG. 7B, in the opening area OA1, only the base layer BS and the first to sixth insulation layers 10 to 60 may exist. In the opening area OA1, the second common cathode electrode CCE2 may be removed or may remain.

Referring to the embodiments of FIG. 7A and FIG. 7B, the thin film encapsulation layer TFE is disposed on the light emitting element layer DP-EDL and encapsulates the first and second light emitting elements LD1 and LD2, respectively. The thin film encapsulation layer TFE may cover the active area AA. The thin film encapsulation layer TFE may cover a portion of the peripheral area NAA.

As shown in the embodiments of FIGS. 7A-7B, the thin film encapsulation layer TFE may include a first inorganic layer 71, an organic layer 72, and a second inorganic layer 73 sequentially stacked along the third direction DR3. In the embodiment of FIGS. 7A-7B, each of the first inorganic layer 71, the organic layer 72, and the second inorganic layer 73 is illustrated as being a single layer. However, embodiments of the present inventive concepts are not limited thereto. For example, in another embodiment, at least one of the first inorganic layer 71, the organic layer 72, or the second inorganic layer 73 may be provided in a plurality or omitted, and is not limited to any one embodiment. For example, the thin film encapsulation layer TFE may include at least one organic layer and at least one inorganic layer and the number of each layer may vary.

The first inorganic layer 71 may cover the first and second common cathode electrodes CCE1 and CCE2. The first inorganic layer 71 may prevent external moisture or oxygen from penetrating into the first and second light emitting elements LD1 and LD2. In an embodiment, the first inorganic layer 71 may include a silicon nitride, a silicon oxide, or a combination thereof. However, embodiments of the present inventive concepts are not limited thereto. In an embodiment, the first inorganic layer 71 may be formed through a deposition process.

The organic layer 72 may be disposed on the first inorganic layer 71 and contact the first inorganic layer 71. The organic layer 72 may provide a flat surface on the first inorganic layer 71.

Bumps formed on an upper surface of the first inorganic layer 71 or particles present in the first inorganic layer 71 are covered by the organic layer 72, so that the surface state (e.g., an uneven surface state, etc.) of the upper surface of the first inorganic layer 71 may be prevented from affecting components formed on the organic layer 72. In addition, the organic layer 72 may relieve stress between contacting layers. In an embodiment, the organic layer 72 may include at least one organic material, and may be formed though a solution process such as spin coating, slit coating, and ink jet processes.

The second inorganic layer 73 is disposed on the organic layer 72 and covers the organic layer 72. The second inorganic layer 73 may be stably formed on a relatively flat surface as compared to an embodiment in which the second inorganic layer 73 is directly disposed on the first inorganic layer 71. The second inorganic layer 73 encapsulates moisture and the like discharged from the organic layer 72 to prevent the moisture and the like from being introduced to the outside. In an embodiment, the second inorganic layer 73 may include a silicon nitride, a silicon oxide, or a combination thereof. In an embodiment, the second inorganic layer 73 may be formed through a deposition process.

The display panel 210 may further include first and second dam portions DMP1 and DMP2 disposed in the peripheral area NAA. As illustrated in FIG. 7A and FIG. 7B, the first and second dam portions DMP1 and DMP2 may have a multi-layered structure. The second dam portion DMP2 may be disposed further outside than the first dam portion DMP1. For example, the second dam portion DMP2 may be farther from the active area AA (e.g., in the first direction DR1) than the first dam portion DMP1. The first dam portion DMP1 includes a first lower dam DM1-L, a first middle dam DM1-M, and a first upper dam DM1-U that are sequentially stacked (e.g., in the third direction DR3). The second dam portion DMP2 includes a second lower dam DM2-L, a second middle dam DM2-M, and a second upper dam DM2-U.

In an embodiment, the first and second lower dams DM1-L and DM2-L may be formed simultaneously with the fifth insulation layer 50. The first and second middle dams DM1-M and DM2-M are respectively disposed on the first and second lower dams DM1-L and DM2-L. In an embodiment, the first and second middle dams DM1-M and DM2-M may be formed simultaneously with the sixth insulation layer 60. The first and second upper dams DM1-U and DM2-U are respectively disposed on the first and second middle dams DM1-M and DM2-M.

The first and second dam portions DMP1 and DMP2 may be provided in the peripheral area NAA in a closed loop shape (e.g., in a plane defined in the first and second directions DR1, DR2) to surround the active area AA. Therefore, the first and second dam portions DMP1 and DMP2 prevent a liquid organic material from spreading to the outside during a process of forming the organic layer 72 of the thin film encapsulation layer TFE. In an embodiment, the organic layer 72 is formed by coating a liquid organic material on the first inorganic layer 71 in an ink-jet manner. At this time, the first and second dam portions DMP1 and DMP2 may set a boundary of a region in which the liquid organic material is disposed.

In an embodiment of the present inventive concepts, the first dam portion DMP1 may partially overlap the first source power line EVSL1 (e.g., in the third direction DR3). FIG. 7A and FIG. 7B illustrate a structure in which two dam portions DMP1 and DMP2 are provided. However, embodiments of the present inventive concepts are not limited thereto. For example, in another embodiment, the display panel 210 may be provided with one dam portion of the first and second dam portions DMP1 and DMP2. In addition, the embodiments of FIG. 7A and FIG. 7B illustrate a structure in which the first and second dam portions DMP1 and DMP2 are spaced apart from each other (e.g., in the first direction DR1). However, embodiments of the present inventive concepts are not limited thereto. For example, in another embodiment, the first and second dam portions DMP1 and DMP2 may be connected to each other. In addition, a structure in which each of the first and second dam portions DMP1 and DMP2 has a triple film structure is illustrated. However, embodiments of the present inventive concepts are not limited thereto and the first and second dam portions DMP1 and DMP2 may have a double film structure, etc. in other embodiments.

FIG. 6 to FIG. 7B illustrate a structure in which the first and second source power lines EVSL1 and EVSL2 do not overlap each other on a plane. For example, the first and second source power lines EVSL1 and EVSL2 may be disposed on the same layer and are spaced apart from each other on a plane (e.g., in the third direction DR3). However, embodiments of the present inventive concepts are not limited thereto. For example, in another embodiment, the first and second source power lines EVSL1 and EVSL2 may be disposed on different layers and are disposed to overlap each other on a plane (e.g., in the third direction DR3).

Figure 8:
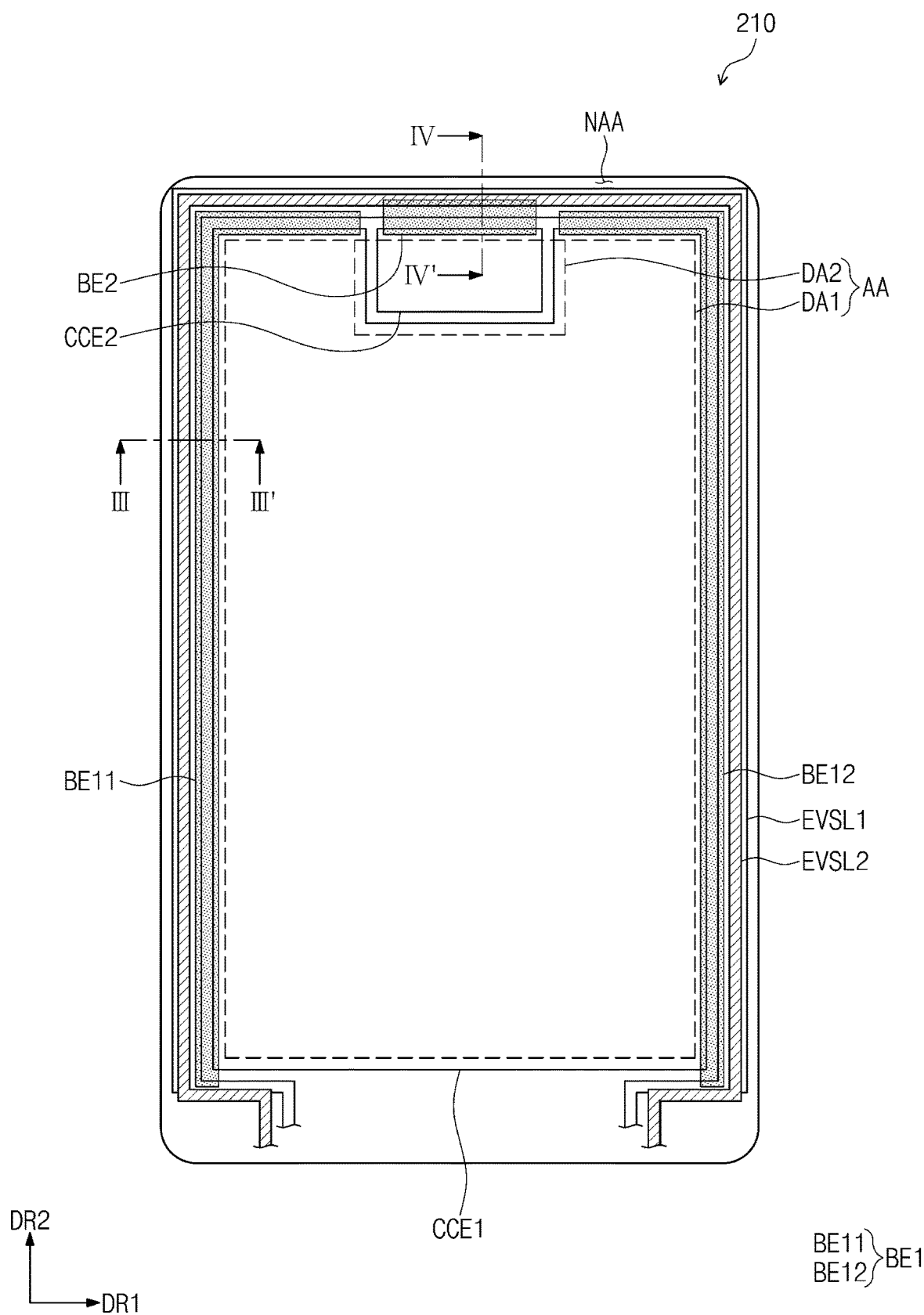
FIG. 8 is a plan view showing a wiring layout of a display panel according to an embodiment of the present inventive concepts.
Figure 9A:
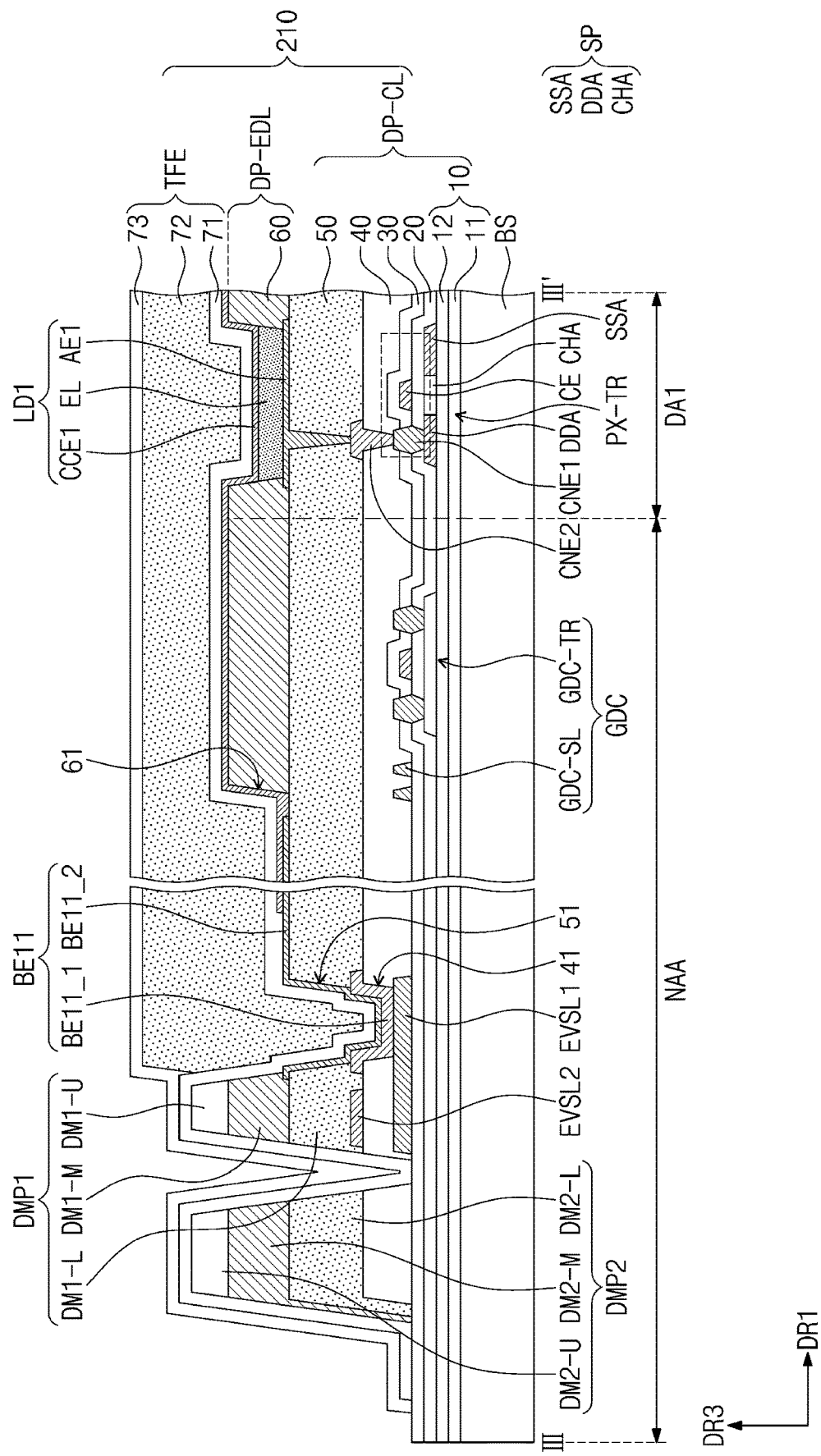
FIG. 9A is a cross-sectional view taken along line III-III' illustrated in FIG. 8 according to an embodiment of the present inventive concepts.
Figure 9B:
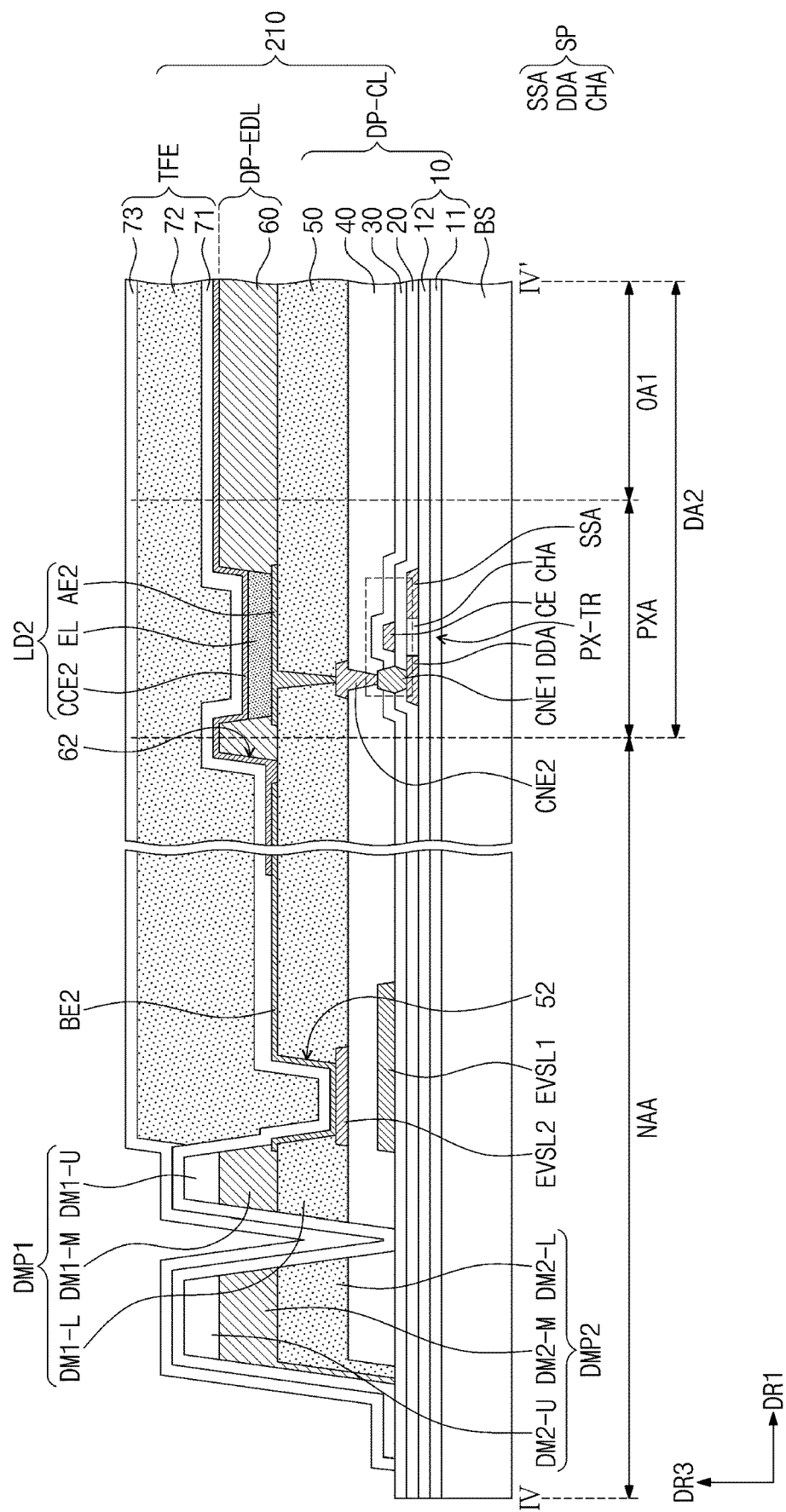
FIG. 9B is a cross-sectional view taken along line IV-IV' illustrated in FIG. 8 according to an embodiment of the present inventive concepts.

FIG. 8 is a plan view showing a wiring layout of a display panel according to an embodiment of the present inventive concepts. FIG. 9A is a cross-sectional view taken along line III-III' illustrated in FIG. 8, and FIG. 9B is a cross-sectional view taken along line IV-IV' illustrated in FIG. 8. In the description of FIG. 8 to FIG. 9B, the same reference numerals are given to the components described with reference to FIG. 6 to FIG. 7B, and the descriptions of substantially identical elements are omitted for convenience of explanation.

Referring to the embodiments of FIG. 8 to FIG. 9B, the fourth and fifth insulation layers 40 and 50 are respectively provided with the first and second contact portions 41 and 51 which expose the first source power line EVSL1. The first and second contact portions 41 and 51 described above may be defined as regions in which the fourth and fifth insulation layers 40 and 50 are open in correspondence to the first source power line EVSL1.

The first bridge electrode BE1 is disposed on the first source power line EVSL1 exposed through the first and second contact portions 41 and 51. FIG. 9A illustrates only the left bridge electrode BE11. However, the right bridge electrode BE12 has a similar structure as the left bridge electrode BE11. The left bridge electrode BE11 includes the first sub-bridge electrode BE11_1 and the second sub-bridge electrode BE11_2.

The first sub-bridge electrode BE11_1 is disposed on the first source power line EVSL1 and the fourth insulation layer 40. In an embodiment, the first sub-bridge electrode BE11_1 and the second connection electrode CNE2 may be formed from the same layer. The first sub-bridge electrode BE11_1 directly contacts the first source power line EVSL1 exposed through the first contact portion 41.

The second sub-bridge electrode BE11_2 is disposed on the first sub-bridge electrode BE11_1 and the fifth insulation layer 50. In an embodiment, the second sub-bridge electrode BE11_2 and the first anode electrode AE1 may be formed from the same layer. The second sub-bridge electrode BE11_2 may directly contact the first source power line BE11_1 exposed through the second contact portion 51.

The third contact portion 61 is provided in the sixth insulation layer 60 to expose the second sub-bridge electrode BE11_2. As shown in the embodiment of FIG. 9A, the first common cathode electrode CCE1 disposed on the sixth insulation layer 60 may directly contact the second sub-bridge electrode BE11_2 in the third contact portion 61.

As shown in the embodiment of FIG. 9B, the second light emitting element LD2 is disposed on the fifth insulation layer 50. The second light emitting element LD2 may include the second anode electrode AE2, the light emitting layer EL, and the second common cathode electrode CCE2. The second anode electrode AE2 may be electrically connected to the pixel transistor PX-TR through the first and second connection electrodes CNE1 and CNE2. The light emitting layer EL may emit light in response to a potential difference between the second anode electrode AE2 and the second common cathode electrode CCE2.

The second common cathode electrode CCE2 may be disposed on the light emitting layer EL. The second common cathode electrode CCE2 may extend (e.g., in the first direction DR1) to be commonly provided to a plurality of second pixels PX2. The second common cathode electrode CCE2 may have a shape that corresponds to the second display area DA2. The second common cathode electrode CCE2 may be electrically connected to the second source power line EVSL2 disposed in the peripheral area NAA.

In an embodiment of the present inventive concepts, the second source power line EVSL2 is formed from the same layer as the second connection electrode CNE2 and the first sub-bridge electrode BE11_1. For example, the second source power line EVSL2 may be formed simultaneously with the second connection electrode CNE2 and the first sub-bridge electrode BE11_1. The first and second source power lines EVSL1 and EVSL2 may be disposed on different layers. For example, as shown in the embodiment of FIGS. 9A-9B, the first and second source power lines EVSL1 and EVSL2 may overlap each other (e.g., in the third direction DR3).

As shown in the embodiments of FIGS. 9A-9B, the first source power line EVSL1 may have a greater width (e.g., length in the first direction DR1) than the second source power line EVSL2. The first and second contact portions 41 and 51 may be provided in a portion in which the first source power line EVSL1 does not overlap the second source power line EVSL2. For example, as shown in the embodiment of FIG. 9A, the first and second contact portions 41 and 51 may not overlap the second source power line EVSL2.

In addition, the first bridge electrode BE1 and the second source power line EVSL2 may not overlap each other on a plane (e.g., in the third direction DR3). For example, the second sub-bridge electrode BE11_1 disposed on the same layer as the second source power line EVSL2 may be spaced apart from the second source power line EVSL2 (e.g., in the first direction DR1) to be electrically insulated from the second source power line EVSL2.

The fifth contact portion 52 is provided in the fifth insulation layer 50 to expose the second source power line EVSL2. The fifth contact portion 52 described above may be defined as a region in which the fifth insulation layer 50 is open in correspondence to the second source power line EVSL2.

The second bridge electrode BE2 is disposed on the second source power line EVSL2 exposed through the fifth contact portion 52. In an embodiment, the second bridge electrode BE2 may have a single-layered structure. For example, the second bridge electrode BE2 may be disposed on the fifth insulation layer 50 similar to the second anode electrode AE2. The second bridge electrode BE2 may directly contact the second source power line EVSL2 exposed through the fifth contact portion 52.

The sixth contact portion 62 is provided in the sixth insulation layer 60 to expose the second bridge electrode BE2. The second common cathode electrode CCE2 disposed on the sixth insulation layer 60 may directly contact the second bridge electrode BE2 in the sixth contact portion 62.

Figure 10:
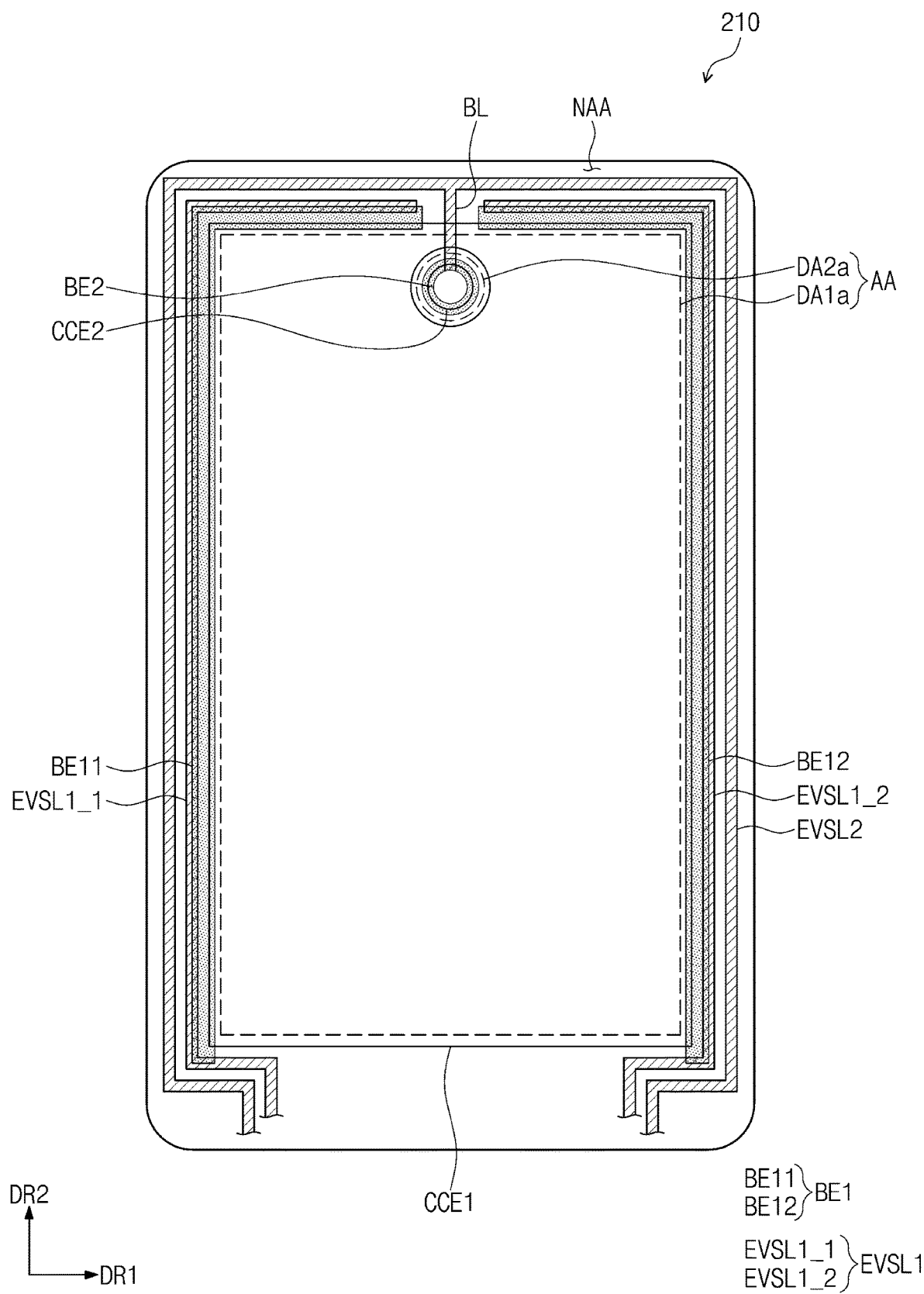
FIG. 10 is a plan view showing a wiring layout of a display panel according to an embodiment of the present inventive concepts.

FIG. 10 is a plan view showing a wiring layout of a display panel according to an embodiment of the present inventive concepts. In the description of FIG. 10, the same reference numerals are given to the components described with reference to FIG. 6, and the descriptions of substantially identical elements are omitted for convenience of explanation.

Referring to the embodiment of FIG. 10, the active area AA of the display panel 210 may be a region on which an image is displayed, and the peripheral area NAA may be a region on which a driving circuit, a driving wiring, and the like may be disposed. In the embodiment of FIG. 10, the active area AA of the display panel 210 includes first and second display areas DA1a and DA2a. The second display area DA2a may be circular shaped and the entire perimeter of the second display area DA2a may be directly adjacent to, and surrounded by, the first display area DA1a. The first common cathode electrode CCE1 is disposed in the first display area DA1a, and the second common cathode electrode CCE2 is disposed in the second display area DA2a. The first and second common cathode electrodes CCE1 and CCE2 may be spaced apart from each other and electrically insulated from each other.

The first common cathode electrode CCE1 may be defined as an electrode formed by commonly connecting the first cathode electrodes of the first light emitting elements LD1 provided in the first pixels PX1 illustrated in the embodiments of FIG. 3A and FIG. 5A. For example, the first cathode electrodes of the first light emitting elements LD1 may be integrally formed and provided in the form of a single electrode, similar to the first common cathode electrode CCE1.

The second common cathode electrode CCE2 may be defined as an electrode formed by commonly connecting second cathode electrodes of the second light emitting elements LD2 provided in the second pixels PX2 illustrated in the embodiments of FIG. 3A and FIG. 5B. For example, the second cathode electrodes of the second light emitting elements LD2 may be integrally formed and provided in the form of a single electrode, similar to the second common cathode electrode CCE1.

The first source power line EVSL1 electrically connected to the first common cathode electrode CCE1 and the second source power line EVSL2 electrically connected to the second common cathode electrode CCE2 are disposed in the peripheral area NAA. As shown in the embodiment of FIG. 10, the first and second source power lines EVSL1 and EVSL2 may be disposed to surround three sides of the active area AA. Pads extended from both ends of the first and second source power lines EVSL1 and EVSL2 may be disposed in the peripheral area NAA in which the pads PD (shown in FIG. 1B) of the display panel 210 are disposed.

As illustrated in the embodiment of FIG. 10, the first source power line EVSL1 may be disposed further inside than the second source power line EVSL2.

The first source power line EVSL1 is electrically connected to the first common cathode electrode CCE1 through the first bridge electrode BE1, and the second source power line EVSL2 is electrically connected to the second common cathode electrode CCE2 through a bridge line BL and the second bridge electrode BE2. The first bridge electrode BE1 may be formed along the first source power line EVSL1.

The first source power line EVSL1 may include a first sub-source power line EVSL1_1 and a second sub-source power line EVSL1_2 separated (e.g., in the first direction DR1) based on the second display area DA2a. In addition, the first bridge electrode BE1 may include the left bridge electrode BE11 and the right bridge electrode BE12 separated (e.g., in the first direction DR1) based on the second display area DA2a.

The left bridge electrode BE11 electrically connects the first sub-source power line EVSL1_1 and the first common cathode electrode CCE1, and the right bridge electrode BE12 electrically connects the second sub-source power line EVSL1_2 and the first common cathode electrode CCE1.

The second display area DA2a is surrounded by the first display area DA1a. For example, the second display area DA2a may be completely surrounded by the first display area DA1a. The bridge line BL may be branched from the second source power line EVSL2 and may extend (e.g., in the second direction DR2) toward the second display area DA2a. The extending portion of the bridge line BL may be disposed between the first and second sub-source power lines EVSL1_1 and EVSL1_2 (e.g., in the first direction DR1).

When viewed in a plane, the bridge line BL extended toward the second display area DA2a may partially overlap the second bridge electrode BE2 (e.g., in the third direction DR3) in the second display area DA2a. The second common cathode electrode CCE2 may also partially overlap (e.g., in the third direction DR3) the second bridge electrode BE2 in the second display area DA2a. The second bridge electrode BE2 electrically connects the bridge line BL and the second common cathode electrode CCE2.

Although not illustrated in the drawings, the second bridge electrode BE2 and the bridge line BL may be disposed to overlap a black matrix layer which is disposed in the second display area DA2a.

Figure 11A:
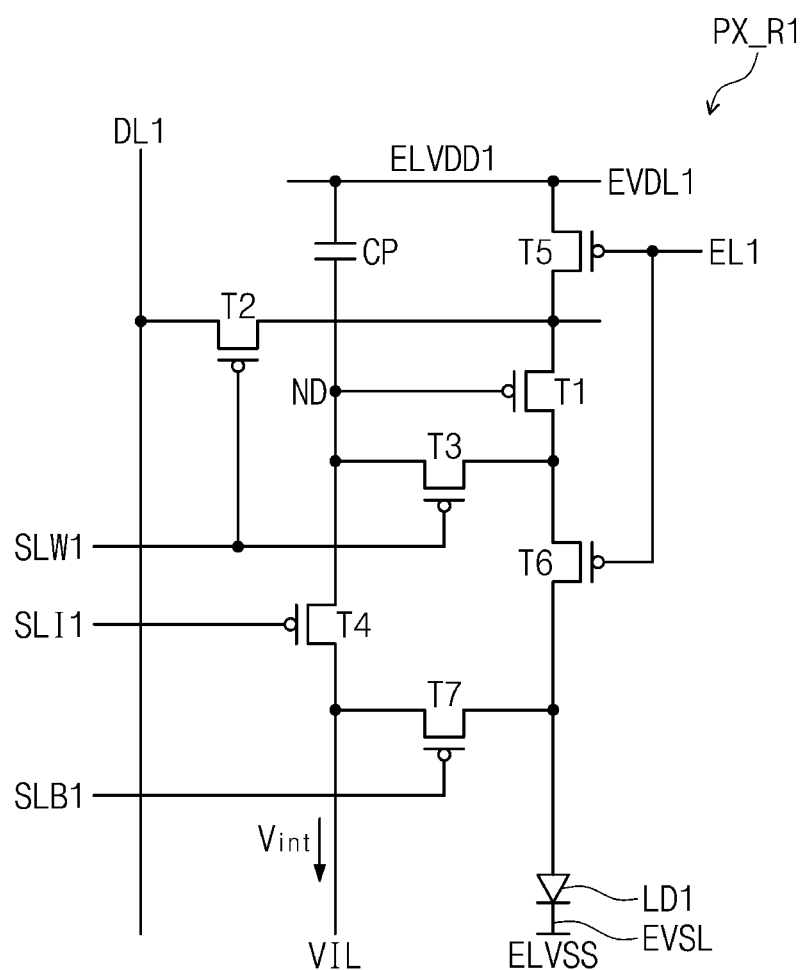
FIG. 11A is an equivalent circuit diagram of a first red pixel according to an embodiment of the present inventive concepts.
Figure 11B:
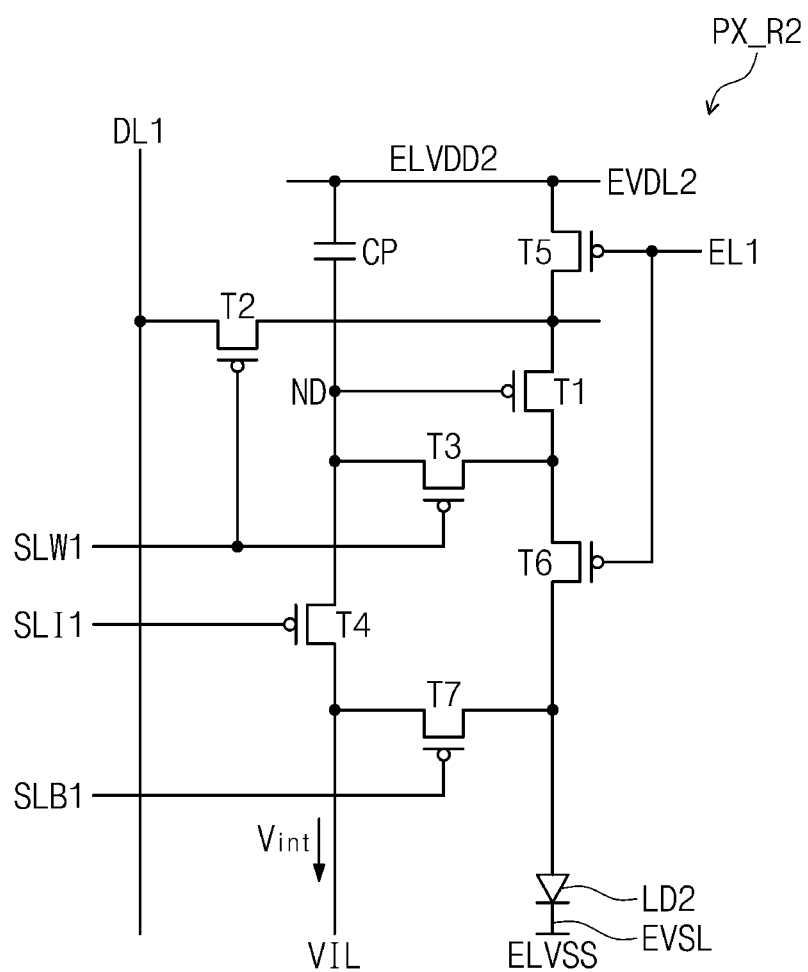
FIG. 11B is an equivalent circuit diagram of a second red pixel according to an example embodiment of the present inventive concepts.

FIG. 11A is an equivalent circuit diagram of a first red pixel according to an embodiment of the present inventive concepts, and FIG. 11B is an equivalent circuit diagram of a second red pixel according to an embodiment of the present inventive concepts. In the description of FIG. 11A and FIG. 11B, the same reference numerals are given to the components described with reference to FIG. 5A and FIG. 5B, and the descriptions of substantially identical elements are omitted for convenience of explanation.

Referring to the embodiment of FIG. 11A, the first red pixel PX_R1 may include a plurality of transistors, such as first to seventh transistors T1 to T7, the capacitor CP, and the first light emitting element LD1. The first to seventh transistors T1 to T7 and the capacitor CP may control the amount of current flowing in the first light emitting element LD1 in response to a data signal and a scan signal.

Each of the first to seventh transistors T1 to T7 may include an input electrode (or a source electrode), an output electrode (or a drain electrode), and a control electrode (or a gate electrode). In the present specification, one of the input electrode and the output electrode may be referred to as a first electrode, and the other one thereof may be referred to as a second electrode for convenience of explanation.

The first electrode of the first transistor T1 may be connected to a driving power line EVDL1 via the fifth transistor T5. A first driving power line EVDL1 may be a wiring provided with a first driving power voltage ELVDD1. The second electrode of the first transistor T1 is connected to the first anode electrode of the first light emitting element LD1 via the sixth transistor T6.

The first transistor T1 may control the amount of current flowing in the first light emitting element LD1 in correspondence to a voltage applied to the control electrode of the first transistor T1.

The capacitor CP is disposed between the first driving power line EVDL1 and the node ND. The capacitor CP stores a voltage corresponding to a data signal. When the fifth transistor T5 and the sixth transistor T6 are turned on, the amount of current flowing through the first transistor T1 may be determined in accordance to the voltage stored in the capacitor CP.

The first light emitting element LD1 may be electrically connected to the sixth transistor T6 and a source power line EVSL. A first anode electrode of the first light emitting element LD1 is connected to the sixth transistor T6, and a first cathode electrode of the first light emitting element LD1 is connected to the source power line EVSL. A source power voltage ELVSS may be applied to a source power line EVSL. The source power voltage ELVSS has a lower level than the first driving power voltage ELVDD1. Therefore, the first light emitting element LD1 may emit light according to a voltage in correspondence to the difference between a signal transmitted through the sixth transistor T6 and the source power voltage ELVSS.

Referring to the embodiment of FIG. 11B, the second red pixel PX_R2 may include a plurality of transistors, such as first to seventh transistors T1 to T7, the capacitor CP, and the second light emitting element LD2. The first to seventh transistors T1 to T7 and the capacitor CP may control the amount of current flowing in the second light emitting element LD2 in response to a data signal and a scan signal.

The first electrode of the first transistor T1 may be connected to a second driving power line EVDL2 via the fifth transistor T5. The second driving power line EVDL2 may be a wiring provided to a second driving power voltage ELVDD2. The second electrode of the first transistor T1 is connected to a second anode electrode of the second light emitting element LD2 via the sixth transistor T6. In an embodiment of the present inventive concepts, the second driving power voltage ELVDD2 may have a voltage level that is higher than a voltage level of the first driving power voltage ELVDD1 (FIG. 11A). For example, when the first driving power voltage ELVDD1 is about 4.6 V, the second driving power voltage ELVDD2 may be about 5.6 V.

The first transistor T1 may control the amount of current flowing in the second light emitting element LD2 in correspondence to a voltage applied to the control electrode of the first transistor T1.

The capacitor CP is disposed between the second driving power line EVDL2 and the node ND. The capacitor CP stores a voltage corresponding to a data signal. When the fifth transistor T5 and the sixth transistor T6 are turned on, the amount of current flowing in the first transistor T1 may be determined in accordance to the voltage stored in the capacitor CP.

The second light emitting element LD2 may be electrically connected to the sixth transistor T6 and the source power line EVSL. The second anode electrode of the second light emitting element LD2 is connected to the sixth transistor T6, and the second cathode electrode of the second light emitting element LD2 is connected to the source power line EVSL. The source power voltage ELVSS may be applied to the source power line EVSL. The source power voltage ELVSS has a lower level than the first and second driving power voltages ELVDD1 and ELVDD2. Therefore, the second light emitting element LD2 may emit light according to a voltage in correspondence to the difference between a signal transmitted through the sixth transistor T6 and the source power voltage ELVSS.

For example, the first transistor T1 and the capacitor CP of the second red pixel PX_R2 is connected to the second driving power line EVDL2 to receive the second driving power voltage ELVDD2, unlike the first transistor T1 and the capacitor CP of the first red pixel PX_R1. In an embodiment of the present inventive concepts, the second driving power voltage ELVDD2 may have a voltage level higher than a voltage level of the first driving power voltage ELVDD1. For example, when the first driving power voltage ELVDD1 is in a range of about 4.6 V to about 5.6 V, the second driving power voltage ELVDD2 may be a voltage in a range of about 5.6V to about 7.6 V.

Therefore, under the same input signal, the potential difference between a voltage applied to the second anode electrode of the second light emitting device LD2 and the source power voltage ELVSS may be increased to be greater than the potential difference between a voltage applied to the first anode electrode of the first light emitting device LD1 and the source power voltage ELVSS. Therefore, under the same input signal, the second light emitting element LD2 may emit light having a higher luminance compared to the first light emitting element LD1.

Figure 12A:
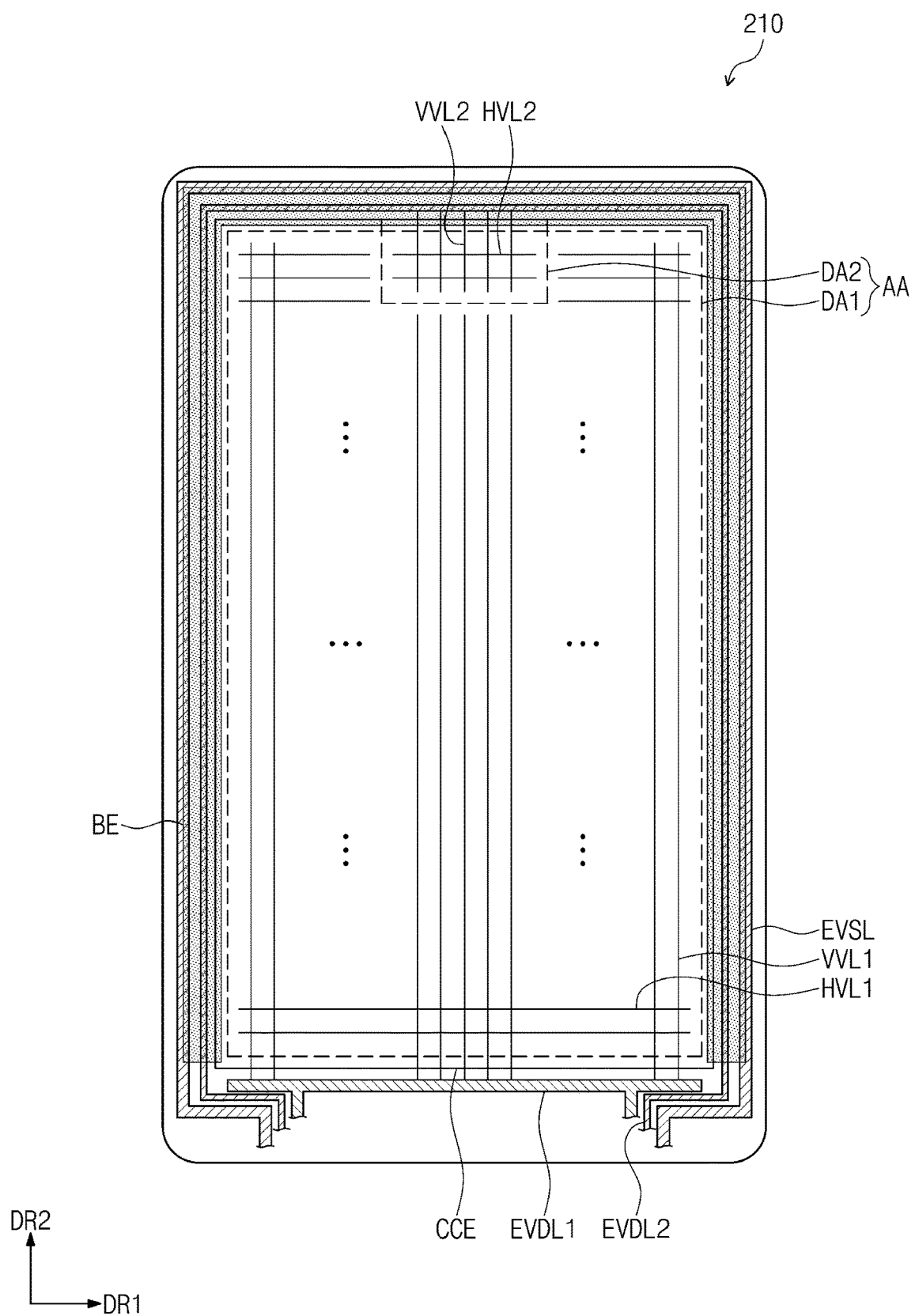
FIG. 12A is a plan view showing a wiring layout of a display panel embodiment of the present inventive concepts.

FIG. 12A is a plan view showing a wiring layout of a display panel according to an embodiment of the present inventive concepts.

Referring to the embodiment of FIG. 12A, the active area AA of the display panel 210 may be a region on which an image is displayed, and the peripheral area NAA may be a region on which a driving circuit, a driving wiring, and the like may be disposed. In the embodiment of FIG. 12A, the active area AA of the display panel 210 includes the first and second display areas DA1 and DA2. A common cathode electrode CCE is disposed in the first and second display areas DA1 and DA2.

The common cathode electrode CCE may be provided in the form of a single electrode by integrally forming the first cathode electrodes of the first light emitting devices LD1 provided in the first pixels PX1 illustrated in the embodiments of FIG. 3A and FIG. 5A and the second cathode electrodes of the second light emitting devices LD2 provided in the second pixels PX2 illustrated in the embodiments of FIG. 3A and FIG. 5B.

The source power line EVSL electrically connected to the common cathode electrode CCE disposed in the peripheral area. As shown in the embodiment of FIG. 12A, the source power line EVSL may be disposed to surround three sides of the active area AA. Pads extended from both ends of the source power line EVSL may be disposed in the peripheral area NAA in which the pads PD (shown in FIG. 18) of the display panel 210 are also disposed.

The first driving power line EVDL1 may be disposed in the peripheral area NAA between (e.g., in the first direction DR1) both ends of the source power line EVSL. The first driving power line EVDL1 may be positioned on one side of the active area AA. For example, as shown in the embodiment of FIG. 12A, the first driving power line EVDL1 is disposed in the peripheral area NAA adjacent a lower side (e.g., in the second direction DR2) of the active area AA.

However, embodiments of the present inventive concepts are not limited thereto. The first driving power line EVDL1 may be electrically connected to a plurality of first horizontal power lines HVL1 that are arranged in the second direction DR2 and extend in the first direction DR1 and a plurality of vertical power lines VVL1 that are arranged in the first direction DR1 and extend in the second direction DR2. The horizontal power lines HVL1 and vertical power lines VVL1 are disposed in the first display area DA1. As shown in the embodiment of FIG. 12A, the plurality of first horizontal power lines HVL1 and the plurality of first vertical power lines VVL1 may intersect each other and be disposed in a mesh form.

The second driving power line EVDL2 may be disposed further inside than the source power line EVSL in the peripheral area NAA. For example, the second driving power line EVDL2 is disposed closer to the active area AA than the source power line EVSL.

The source power line EVSL is electrically connected to the common cathode electrode CCE through the bridge electrode BE. The bridge electrode BE may be formed along the source power line EVSL. When viewed in a plane, the source power line EVSL may partially overlap the bridge electrode BE (e.g., in the third direction DR3).

As shown in the embodiment of FIG. 12A, the second driving power line EVDL2 may be disposed to surround three sides of the active area AA along the source power line EVSL. The second driving power line EVDL2 may be electrically connected to a plurality of second horizontal power lines HVL2 and a plurality of vertical power lines VVL2 disposed in the second display area DA2. The plurality of second horizontal power lines HVL2 and the plurality of second vertical power lines VVL2 may intersect each other and be disposed in a mesh form.

The plurality of second horizontal power lines HVL2 and the plurality of second vertical power lines VVL2 may be electrically insulated from the plurality of first horizontal power lines HVL2 and the plurality of second vertical power lines VVL2.

Therefore, as shown in the embodiments of FIG. 11A to FIG. 12A, the first red pixel PX_R1 may receive the first driving power voltage ELVDD1 through the first driving power line EVDL1, the first horizontal power lines HVL1, and the first vertical power lines VVL1. The second red pixel PX_R2 may receive the second driving power supply voltage ELVDD2 having a higher voltage level than the first driving power voltage ELVDD1 through the second driving power line EVDL2, the second horizontal power lines HVL2, and the second vertical power lines VVL2.

Therefore, under the same input signal, the second light emitting element LD2 may output light having a higher luminance compared to the first light emitting element LD1, and as a result, the sharpness of the second display area DA2 may be improved.

Figure 12B:
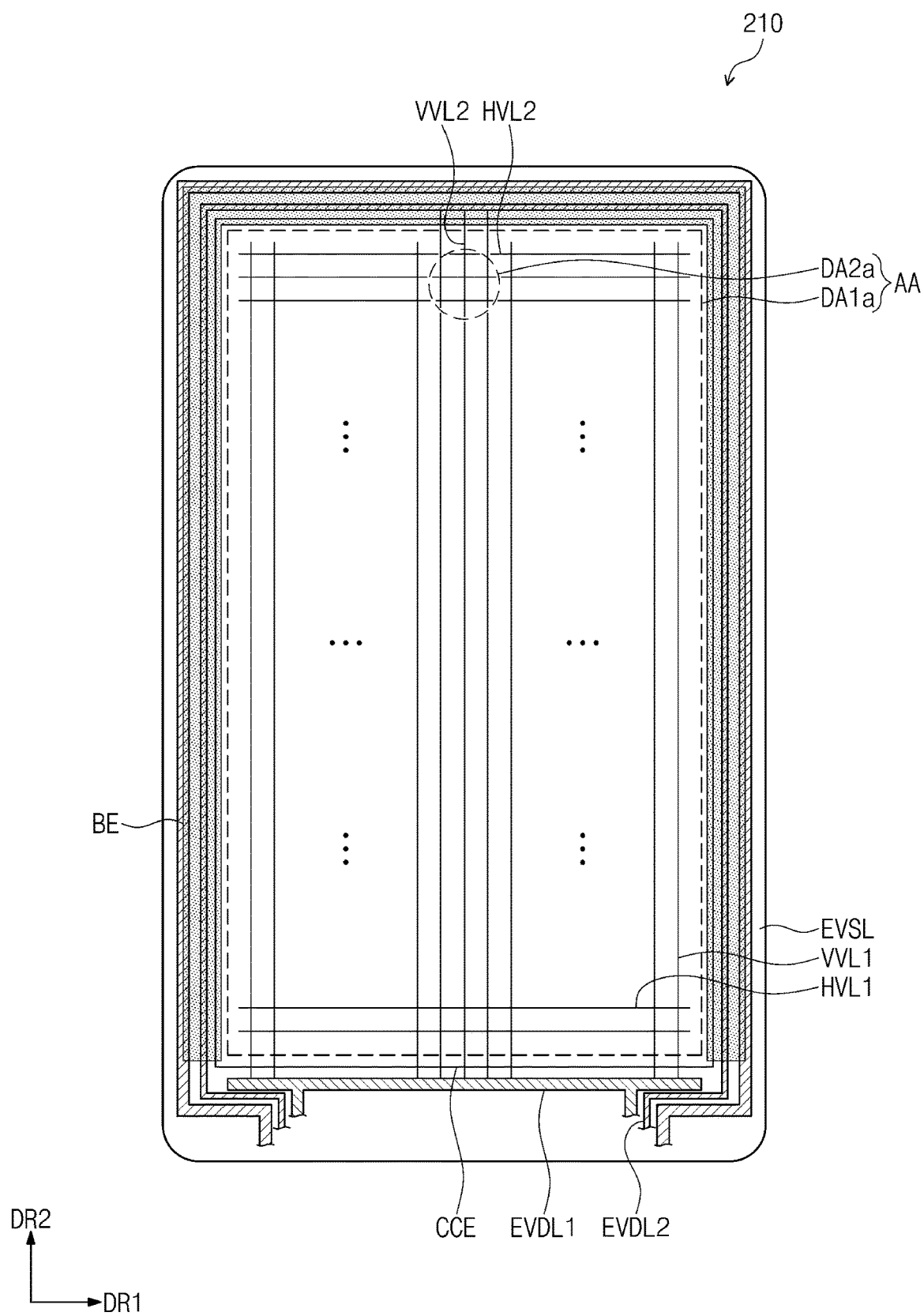
FIG. 12B is a plan view showing a wiring layout of a display panel embodiment of the present inventive concepts.

FIG. 12B is a plan view showing a wiring layout of a display panel according to an embodiment of the present inventive concepts. Hereinafter, in the description of FIG. 12B, the same reference numerals are given to the components described with reference to FIG. 12A, and the descriptions of substantially identical elements are omitted for convenience of explanation.

Referring to the embodiment of FIG. 12B, the second display area DA2a is surrounded by the first display area DA1a. For example, the second display area DA2a may have a circular shape and the entire perimeter of the second display area DA2a may be directly adjacent to, and surrounded by, the first display area DA1a.

The second driving power line EVDL2 may be disposed to surround three sides of the active area AA along the source power line EVSL. The second driving power line EVDL2 may be electrically connected to a plurality of second horizontal power lines HVL2 and a plurality of vertical power lines VVL2 disposed in the second display area DA2a. The plurality of second horizontal power lines HVL2 and the plurality of second vertical power lines VVL2 may be disposed in a mesh form by intersecting each other.

The plurality of second horizontal power lines HVL2 and the plurality of second vertical power lines VVL2 may be electrically insulated from the plurality of first horizontal power lines HVL2 and the plurality of second vertical power lines VVL2.

Therefore, the first red pixel PX_R1 may receive the first driving power voltage ELVDD1 through the first driving power line EVDL1, the first horizontal power lines HVL1, and the first vertical power lines VVL1. The second red pixel PX_R2 may receive the second driving power supply voltage ELVDD2 having a higher voltage level than the first driving power voltage ELVDD1 through the second driving power line EVDL2, the second horizontal power lines HVL2, and the second vertical power lines VVL2.

Therefore, under the same input signal, the second light emitting element LD2 may output light having a higher luminance compared to the first light emitting element LD1, and as a result, the sharpness of the second display area DA2 may be improved.

According to an embodiment of the present inventive concepts, a difference in sharpness between a first display area having a first light transmittance and a second display area having a second light transmittance that is higher than the first light transmittance is reduced based on different magnitudes of power supply voltages supplied to a first pixel of the first display area and a second pixel of the second display area. As a result, in the same input signal, the brightness of light output from a second light emitting element is increased as compared to the brightness of light output from a first light emitting element to reduce the sharpness difference between the first and second display areas, thereby improving the overall display quality.

Although the present inventive concepts have been described with reference to embodiments thereof, it will be understood by those skilled in the art that various modifications and changes in form and details may be made therein without departing from the spirit and scope of the present inventive concepts as set forth in the following claims. Accordingly, the technical scope of the present inventive concepts is not intended to be limited to the contents set forth in the detailed description of embodiments.

What is claimed is:

1. A display panel comprising a first display area having a first light transmittance and a second display area having a second light transmittance that is higher than the first light transmittance, wherein the display panel further comprises:
    a plurality of first pixels disposed in the first display area, each of the plurality of first pixels comprises a first light emitting element;
    a plurality of second pixels disposed in the second display area, each of the plurality of second pixels comprises a second light emitting element;
    a first source power line connected to a first cathode electrode of the first light emitting element, the first source power line is configured to provide a first source power voltage; and
    a second source power line connected to a second cathode electrode of the second light emitting element, the second source power line is configured to provide a second source power voltage having a voltage level that is different from a voltage level of the first source power voltage.

2. The display panel of claim 1, wherein the voltage level of the second source power voltage is less than the voltage level of the first source power voltage.

3. The display panel of claim 2, wherein:
the plurality of first pixels further comprises at least one first transistor; and
the plurality of second pixels further comprises at least one second transistor.

4. The display panel of claim 3, wherein the at least one first transistor and the at least one second transistor are configured to connect a third power line to first and second anode electrodes of the first and second light emitting elements, respectively.

5. The display panel of claim 1, further comprising a peripheral area surrounding the first display area, wherein the first and second source power lines are disposed in the peripheral area.

6. The display panel of claim 5, further comprising:
a first bridge electrode configured to connect the first source power line and the first cathode electrode of the first light emitting element; and
a second bridge electrode configured to connect the second source power line and the second cathode electrode of the second light emitting element.

7. The display panel of claim 6, wherein the first bridge electrode and the second bridge electrode are disposed on a same layer and do not overlap each other.

8. The display panel of claim 7, wherein the first bridge electrode comprises left and right bridge electrodes that are separated by the second bridge electrode.

9. The display panel of claim 6, wherein the first and second source power lines are disposed on a same layer and do not overlap each other.

10. The display panel of claim 6, wherein the first and second source power lines are disposed on different layers and partially overlap each other.

11. The display panel of claim 6, wherein:
the second display area is surrounded by the first display area; and
the display panel further includes a bridge line that is branched from the second source power line and extends toward the second display area.

12. The display panel of claim 11, wherein the bridge line is connected to the second cathode electrode of the second light emitting element through the second bridge electrode.

13. The display panel of claim 11, wherein:
the first source power line comprises first and second sub-power lines that are separated by the bridge line; and
the first and second sub-power lines do not overlap each other.

14. The display panel of claim 1, wherein:
each of the plurality of first pixels further comprises at least one first transistor; and
each of the plurality of second pixels further comprises at least one second transistor.

15. The display panel of claim 14, further comprising:
a first driving power line being configured to provide a first driving power voltage; and
a second driving power line being configured to provide a second driving power voltage having a voltage level that is different from a voltage level of the first driving power voltage, and
wherein:
the at least one first transistor is configured to connect the first driving power line to a first anode electrode of the first light emitting element; and
the at least one second transistor is configured to connect the second driving power line to a first anode electrode of the second light emitting element.

16. The display panel of claim 15, wherein the voltage level of the second driving power voltage is greater than the voltage level of the first driving power voltage.

17. The display panel of claim 1, wherein:
the second display area comprises a plurality of pixel areas in which the plurality of second pixels are disposed; and
an opening area in which the plurality of first pixels and the plurality of second pixels are not disposed.

18. The display panel of claim 17, wherein, a total area of the pixel areas is less than a total area of the opening areas in the second display area.

19. A display device comprising:
a display panel including a first display area having a first resolution and a second display area having a second resolution that is lower than the first resolution, the display panel including a first common cathode electrode disposed in the first display area and a second common cathode electrode disposed in the second display area; and
an electronic module disposed below the second display area,
wherein the display panel further includes:
a first source power line electrically connected to the first common cathode electrode and configured to provide a first source power voltage; and
a second source power line electrically connected to the second common cathode electrode and configured to provide a second source power voltage having a voltage level that is different from a voltage level of the first source power voltage.

20. The display device of claim 19, wherein the first and second common cathode electrodes are electrically insulated from each other.

21. The display device of claim 19, wherein the voltage level of the second source power voltage is less than the voltage level of the first source power voltage.

* * * * *